(12) United States Patent
Noda

(10) Patent No.: US 12,225,736 B2
(45) Date of Patent: Feb. 11, 2025

(54) NONVOLATILE SEMICONDUCTOR MEMORY DEVICE AND FABRICATION METHOD OF THE NONVOLATILE SEMICONDUCTOR MEMORY DEVICE

(71) Applicant: Kioxia Corporation, Tokyo (JP)

(72) Inventor: Kotaro Noda, Mie (JP)

(73) Assignee: Kioxia Corporation, Tokyo (JP)

( * ) Notice: Subject to any disclaimer, the term of this patent is extended or adjusted under 35 U.S.C. 154(b) by 833 days.

(21) Appl. No.: 17/203,110

(22) Filed: Mar. 16, 2021

(65) Prior Publication Data

US 2021/0210556 A1 Jul. 8, 2021

Related U.S. Application Data

(63) Continuation of application No. PCT/JP2019/005631, filed on Feb. 15, 2019.

(51) Int. Cl.
*H10B 63/00* (2023.01)
*H10N 70/00* (2023.01)

(52) U.S. Cl.
CPC ............ *H10B 63/84* (2023.02); *H10B 63/20* (2023.02); *H10N 70/063* (2023.02)

(58) Field of Classification Search
CPC ...... H10N 63/84; H10N 63/20; H10N 70/826; H10N 70/821–828; H10N 70/00–068; G11C 2213/71; G11C 2213/70–82; G11C 13/003; H01L 27/105; H10B 63/84–845; H10B 99/10; H10B 51/20; H10B 53/20
See application file for complete search history.

(56) References Cited

U.S. PATENT DOCUMENTS

| | | | |
|---|---|---|---|
| 8,183,552 B2 | 5/2012 | Nakajima | |
| 8,735,861 B2 | 5/2014 | Noda | |
| 8,822,968 B2 | 9/2014 | Inokuma | |
| 2011/0031468 A1* | 2/2011 | Fukumizu | H01L 27/101 |
| | | | 257/E21.003 |

(Continued)

FOREIGN PATENT DOCUMENTS

| | | | |
|---|---|---|---|
| JP | 2010-067942 A | 3/2010 | |
| JP | 2013-201405 A | 10/2013 | |

(Continued)

*Primary Examiner* — Bryan R Junge
*Assistant Examiner* — Mario Andres Autore, Jr.
(74) *Attorney, Agent, or Firm* — Foley & Lardner LLP

(57) ABSTRACT

A certain embodiment includes: first wiring layers extended in a first direction arranged in a second direction crossing the first direction; second wiring layers, including two layers having mutually different materials, extended in the second direction arranged in the first direction above the first wiring layers; third wiring layers extended in the first direction arranged in the second direction above the second wiring layers; a first memory cell disposed between one second wiring layer and one first wiring layer between the second and first wiring layers; a second memory cell disposed between one third wiring layer and the one second wiring layer between the third and second wiring layers; a third memory cell disposed between the one second wiring layer and another closest first wiring layer adjacent to the first wiring layer having the first memory cell; and an insulation layer disposed between the first and third memory cells.

16 Claims, 28 Drawing Sheets

(56) References Cited

U.S. PATENT DOCUMENTS

| | | | |
|---|---|---|---|
| 2012/0313072 A1* | 12/2012 | Baek | H01L 27/0688 |
| | | | 257/4 |
| 2013/0248796 A1 | 9/2013 | Inokuma | |
| 2014/0346428 A1* | 11/2014 | Sills | H10B 63/84 |
| | | | 257/4 |
| 2014/0347911 A1* | 11/2014 | Minemura | H10N 70/063 |
| | | | 365/148 |
| 2015/0243708 A1 | 8/2015 | Ravasio | |
| 2017/0271581 A1* | 9/2017 | Seong | H10N 70/826 |
| 2018/0096092 A1 | 4/2018 | Kim | |
| 2019/0252609 A1 | 8/2019 | Sei | |

FOREIGN PATENT DOCUMENTS

| | | |
|---|---|---|
| JP | 2014-049751 A | 3/2014 |
| JP | 2017-510983 A | 4/2017 |
| TW | 201814562 A | 4/2018 |
| TW | 201830739 A | 8/2018 |
| WO | WO-2018/203459 A1 | 11/2018 |

* cited by examiner ately to a storage device easily capable of power saving.

NONVOLATILE SEMICONDUCTOR MEMORY DEVICE AND FABRICATION METHOD OF THE NONVOLATILE SEMICONDUCTOR MEMORY DEVICE

CROSS REFERENCE TO RELATED APPLICATIONS

This is a continuation application (CA) of PCT Application No. PCT/JP2019/005631, filed on Feb. 15, 2019, which claims priority to PCT Application No. PCT/JP2019/005631, filed on Feb. 15, 2019 and the entire contents of which are incorporated herein by reference.

FIELD

Embodiments described herein relate generally to a nonvolatile semiconductor memory device and a fabrication method of the nonvolatile semiconductor memory device.

BACKGROUND

In recent years, a Resistive Random Access Memory (ReRAM) using a resistance variation of a film has been developed. As a kind of the ReRAM, a phase change memory (PCM) has been developed which utilizes a resistance variation due to a thermal phase transition between a crystalline state and an amorphous state in a storage area of a film. Moreover, since a superlattice PCM in which two different alloys are repeatedly stacked can change a phase of the film with a small amount of electric currents, it has attracted attention as a storage device easily capable of power saving.

DETAILED DESCRIPTION

Figure 1:
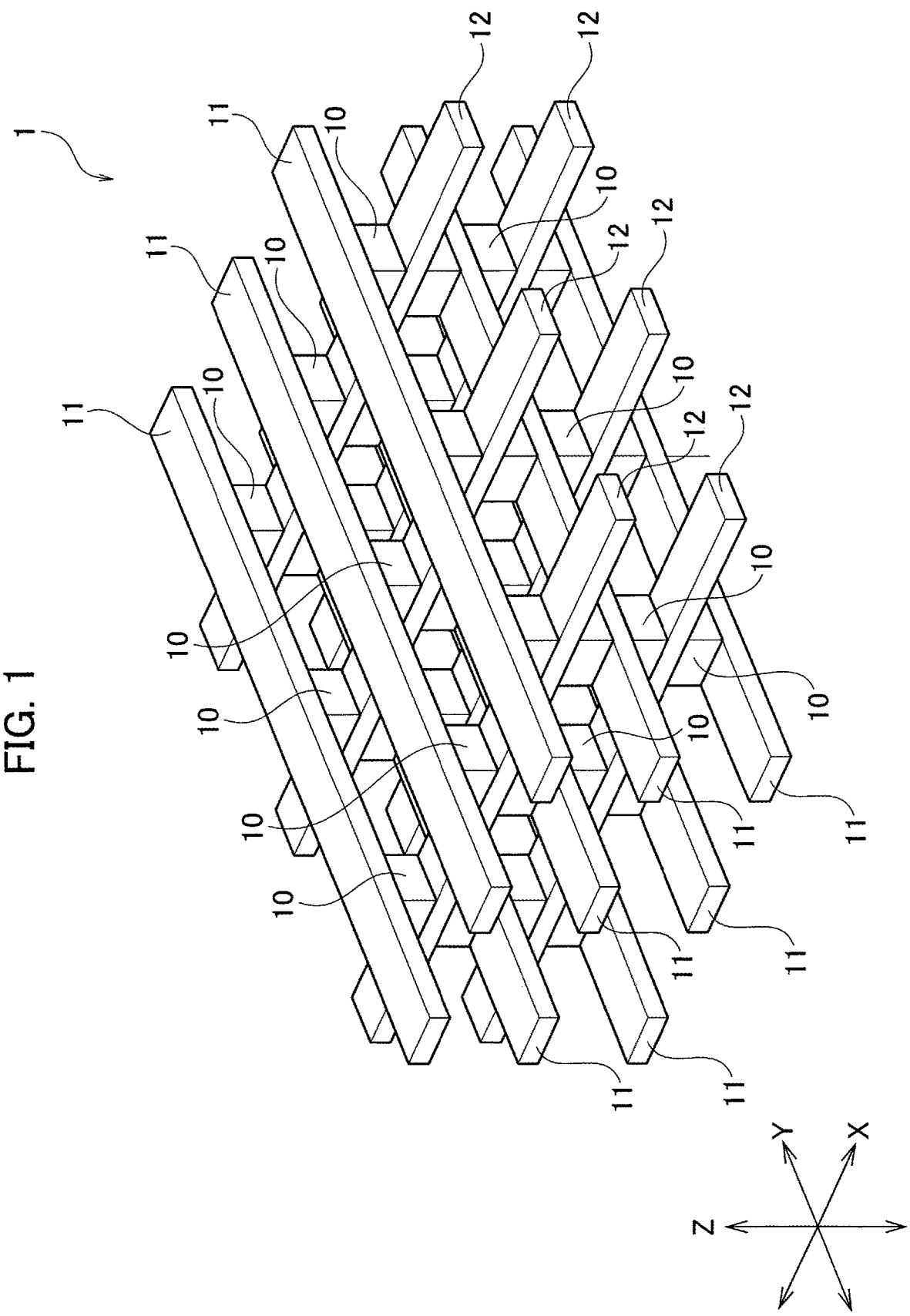
FIG. 1 is a schematic bird's-eye view configuration diagram of a nonvolatile semiconductor memory device according to the embodiments.

Next, certain embodiments will now be described with reference to drawings. In the description of the following drawings to be explained, the identical or similar reference sign is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

Certain embodiments disclosed herein provide a nonvolatile semiconductor memory device capable of reducing a wiring sheet resistance, and a fabrication method of such a nonvolatile semiconductor memory device.

A nonvolatile semiconductor memory device according to the embodiments includes a plurality of first wiring layers, a plurality of second wiring layers, a plurality of third wiring layers, a first memory cell, a second memory cell, a third memory cell, and an insulation layer. The plurality of the first wiring layers are extended in a first direction, and are arranged in a second direction crossing the first direction. The plurality of the second wiring layers are extended in the second direction and are arranged above the plurality of the first wiring layers in the first direction. The plurality of the third wiring layers are extended in the first direction and are arranged above the plurality of the second wiring layers in the second direction. The first memory cell is disposed between one second wiring layer of the plurality of the second wiring layers and one first wiring layer of the plurality of the first wiring layers at a crossing portion between the plurality of the second wiring layers and the plurality of the first wiring layers. The first memory cell comprises a first cell unit including a first variable resistance film and a first selector unit including a first selector. The second memory cell is disposed between one third wiring layer of the plurality of the third wiring layers and the one second wiring layer at a crossing portion between the plurality of the third wiring layers and the plurality of the second wiring layers. The second memory cell comprises a second cell unit including a second variable resistance film and a second selector unit including a second selector. The third memory cell is disposed between the one second wiring layer and another closest first wiring layer adjacent in the second direction to the first wiring layer on which the first memory cell is disposed. The third memory cell comprises a third cell unit including a third variable resistance film and a third selector unit including a third selector. The insulation layer is disposed between the first memory cell and the third memory cell. The second wiring layer has a stacked structure including at least two layers having mutually different materials.

[Embodiments]

Figure 2:
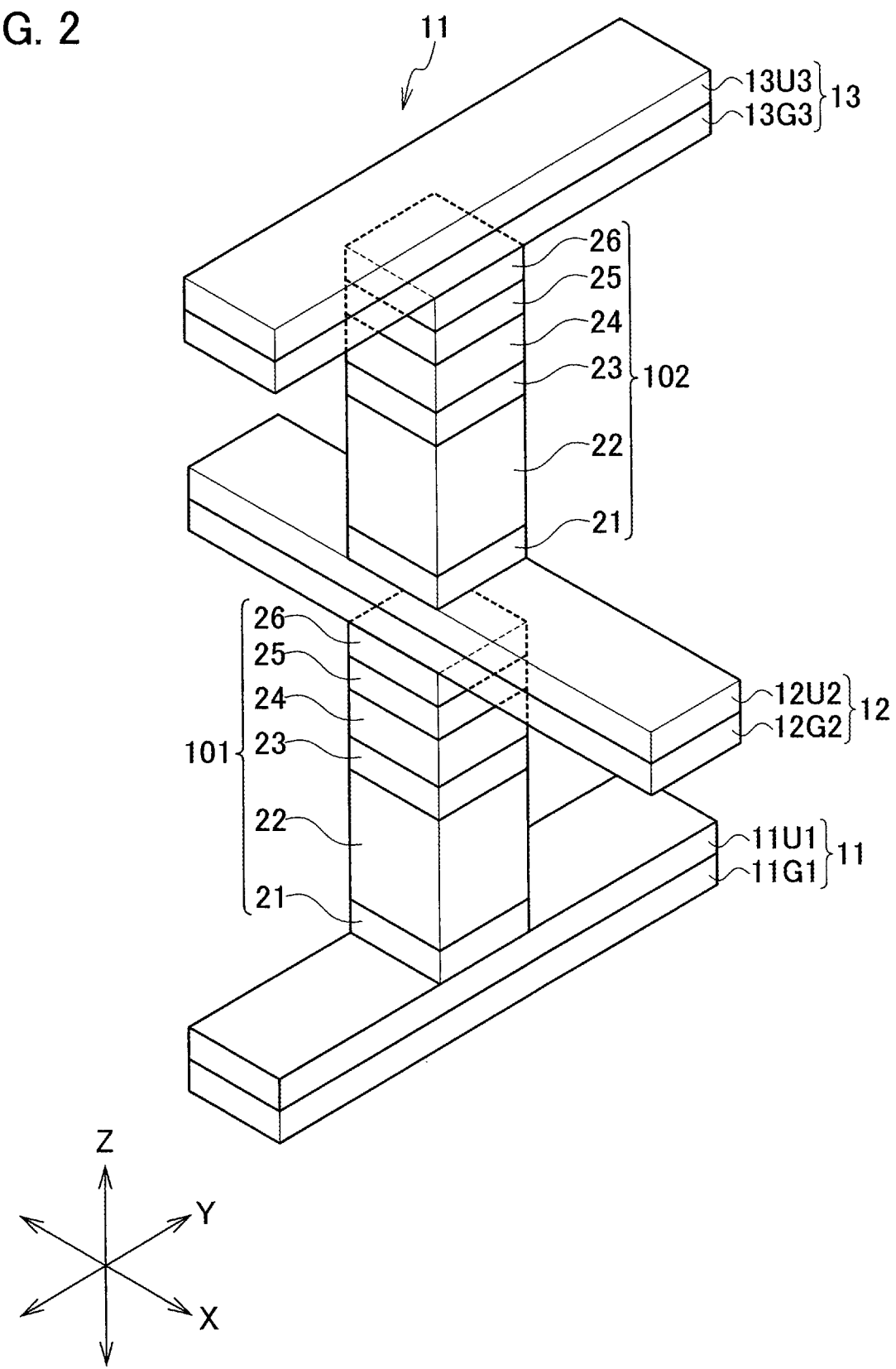
FIG. 2 is a schematic bird's-eye view configuration diagram of two-stage configuration portion of the memory cell of FIG. 1.

FIG. 1 illustrates a schematic bird's-eye view configuration of a nonvolatile semiconductor memory device according to the embodiments 1, and four layers are stacked in an array of 3 lines×3 columns, for example. FIG. 2 illustrates a schematic bird's-eye view configuration of a two-stage configuration portion of memory cells shown in FIG. 1.

As illustrated in FIG. 1, the nonvolatile semiconductor memory device according to the embodiments 1 includes a cross-point type memory structure, and includes: a plurality of first wiring layers 11 disposed on the same plane; a plurality of second wiring layers 12 disposed on the same plane on the plurality of first wiring layers 11 to be three-dimensionally crossed respectively with the plurality of first wiring layers 11; and a memory cell 10 disposed between the second wiring layer 12 and the first wiring layer 11 at a crossing portion between each of the plurality of second wiring layers 12 and each of the plurality of first wiring layers 11. The nonvolatile semiconductor memory device 1 according to the embodiments may be disposed on an insulating substrate including an insulation layer formed on a semiconductor substrate, for example.

The first wiring layer 11 and the second wiring layer 12 are three-dimensionally crossed with each other in non-parallel. For example, as illustrated in FIG. 1, a plurality of the memory cells 10 are disposed in a matrix in two-dimensional direction (X-Y direction), and a plurality of layers of the matrix array thereof are further stacked in a Z axial direction orthogonal to the X-Y plane. The first wiring layer 11 is shared between upper and lower memory cells 10, and the second wiring layer 12 is similarly shared between upper and lower memory cells 10. In FIG. 1, although an interlayer insulating film is disposed between the plurality of first wiring layers 11 and the plurality of second wiring layers 12, illustration thereof is omitted.

In the following description, the first wiring layer 11 may be referred to as a lower wiring layer or a bit line, and the second wiring layer 12 may be referred to as an upper wiring layer or a word line. Moreover, the cross-point type memory structure can be stacked in a plurality of layers. The names of the bit line and the word line may be reversed from each other.

To the nonvolatile semiconductor memory device according to the embodiments, a Resistive Random Access Memory (ReRAM), a Phase-Change Memory (PCM), a Ferroelectric Random Access Memory (FeRAM), or the like can also be applied. Moreover, a Magneto Tunnel Junction (MTJ) resistance change element can also be applied thereto. In the following description, the PCM will mainly be described.

(Configuration of Memory Cell)

As illustrated in FIG. 2, the memory cell 10 of the nonvolatile semiconductor memory device according to the embodiments includes a storage element connected in series between the first wiring layer 11 and the second wiring layer 12, and a selector 22. The storage element includes a variable resistance film 24.

As illustrated in FIG. 2, the first wiring layer 11 may include a double layered structure including a first lower wiring layer 11G1 and a first upper wiring layer 11U1. Moreover, the second wiring layer 12 may include a double layered structure including a second lower wiring layer 12G2 and a second upper wiring layer 12U2. The third wiring layer 13 may include a double layered structure including a third lower wiring layer 13G3 and a third upper wiring layer 13U3.

The first memory cell 101 disposed between the second wiring layer 12 and the first wiring layer 11 includes stacked films (21, 22, 23, 24, 25, 26), and the second memory cell 102 disposed between the third wiring layer 13 and the second wiring layer 12 similarly includes stacked films (21, 22, 23, 24, 25, 26). Both the first memory cell 101 and the second memory cell 102 correspond to the memory cell 10 as illustrated in FIG. 1, but are distinguished from each other as a matter of convenience of explanation. Similarly, the third wiring layer 13 corresponds to the first wiring layer 11 as illustrated in FIG. 1, but it is distinguished therefrom as a matter of convenience of explanation.

The selector 22 may be a two terminals switch device, for example. When a voltage applied between the two terminals is less than a threshold value, the switch device is in a "high resistivity" state, e.g., an electrically non-conductive state. When the voltage applied between the two terminals is equal to or more than the threshold value, the state of the switch device is changed to a "low resistivity" state, e.g., an electrically conductive state. The switch device may have such a function regardless of the polarity of the voltage. The switch device contains at least one kind of chalcogen elements selected from the group including tellurium (Te), selenium (Se), and sulfur (S). Alternatively, the switch device may contain chalcogenide which is a compound including the above-mentioned chalcogen element. The switch device may further contain at least one kinds of elements selected from the group including boron (B), aluminum (Al), gallium (Ga), indium (In), carbon (C), silicon (Si), germanium (Ge), tin (Sn), arsenic (As), phosphorus (P), and antimony (Sb).

Moreover, the selector 22 can be configured of a silicon diode or the like having a p-intrinsic-n (PIN) structure, for example.

The variable resistance film 24 can electrically switch between a state where the resistance is relatively low (i.e., set state) and a state where the resistance is relatively high (i.e., reset state), and stores data in a nonvolatile manner. The selector 22 prevents a sneak current when electrically accessing (e.g., forming/writing/erasing/reading) the selected memory cell.

The variable resistance film 24 contains a metallic oxide, for example. As the metallic oxide thereof, there can be used one kind of metal or an oxide of an alloy of two or more kinds of metals selected from the group including zirconium (Zr), titanium (Ti), aluminum (Al), hafnium (Hf), manganese (Mn), tantalum (Ta), and tungsten (W), for example.

When the memory cell 10 is formed as a superlattice PCM, the variable resistance film 24 is formed as a supperlattice structure in which a plurality of chalcogenide compound layers are stacked. The chalcogenide compound used for the variable resistance film 24 is composed of two or more chalcogenide compounds, such as antimony telluride as $Sb_2Te_3$, germanium telluride as GeTe, for example. In order to stabilize a phase change, it is preferable that one kind of the chalcogenide compound contains antimony (Sb) or bismuth (Bi). The selector 22 is formed of a chalcogenide compound of a transition metal. This chalcogenide compound is a compound of: one or more kind of transition metals selected from the group including titanium (Ti) and vanadium (V), copper (Cu), zinc (Zn), chromium (Cr), zirconium (Zr), platinum (Pt), palladium (Pd), molybdenum (Mo), nickel (Ni), manganese (Mn), and hafnium (Hf); and one or more kind of chalcogen elements selected from the group including sulfur (S), selenium (Se), and tellurium (Te), for example. More preferably, the chalcogenide compound is a compound of which the composition is expressed by chemical formula MX or $MX_2$ where M is a transition metal and X is a chalcogen element. When the composition is MX, the concentration of the transition metal M in the chalcogenide compound is 50 atomic %, and when the composition is $MX_2$, the concentration of transition metal M is 33 atomic %. However, since there is an allowable range in the composition of each compound, the preferable concentration of the transition metal M in the chalcogenide compound is equal to or greater than 20 atomic % and equal to or less than 60 atomic %. In the present embodiments, the chalcogenide compound is $TiTe_2$.

The variable resistance film 24 is sandwiched between a conductive film 25 and a conductive film 23. The conductive film 25 and the conductive film 23 include a metal film or a metal nitride film. As the conductive film 25 and the conductive film 23, it is also possible to use a titanium nitride film, for example.

An electrode layer 26 is disposed between the conductive film 25 and the second wiring layer 12. W, Ti, Ta, or a nitride thereof can be applied to the electrode layer 26, for example. Moreover, the variable resistance film 24 may be formed of Si, and the electrode layer 26 may be formed of Ni or Pt. The materials of the first wiring layer 11 and the second wiring layer 12 will be described below.

A conductive film 21 is disposed between the first wiring layer 11 and the selector 22. The conductive film 21 includes a metal film or a metal nitride film. The conductive film 21 may include a conducting material, such as a titanium nitride (TiN), W, Cu, or Al, for example. The conductive film 21 is connected to the first wiring layer 11.

The conductive films 21, 23, and 25 prevent diffusion of material elements between the upper and lower layers respectively sandwiching the conductive films 21, 23, and 25. Moreover, the conductive films 21, 23, and 25 improve adhesion between the upper and lower layers respectively sandwiching the conductive films 21, 23, and 25.

When a reset voltage is applied to the variable resistance film 24 in a low resistivity state (i.e., set state) having a relatively low resistivity, through the first wiring layer 11 and the second wiring layer 12, the variable resistance film 24 can be switched from the set state to a high resistivity state (i.e., reset state) having a relatively high resistivity. When a set voltage higher than the reset voltage is applied to the variable resistance film 24 in the high resistivity state (i.e., reset state), the variable resistance film 24 can be switched therefrom to the low resistivity state (i.e., set state).

Although the details of a fabrication method thereof will be described below, the fundamental structure illustrated in FIG. 1 can be fabricated as follows, for example. After stacking stacked film including the memory cell 10 on the lower wiring layer 11, the stacked film and the lower wiring layer 11 are processed into a line shape in the Y direction, and embedding an interlayer insulating film in a trench between the stacked films formed by the aforementioned processing, and then the upper wiring layer 12 is formed on the stacked film and the interlayer insulating film. The upper wiring layer 12 is processed into a line shape in the X direction, and further the stacked films and the interlayer insulating film under between upper wiring layers 12 which are processed into the line shape are also processed, and thereby the memory cell 10 composed of a substantially pillar-shaped (hereinafter, simply referred to as "pillar-shaped") plurality of stacked films can be formed at a crossing portion between the upper wiring layer 12 and the lower wiring layer 11.

Figure 3:
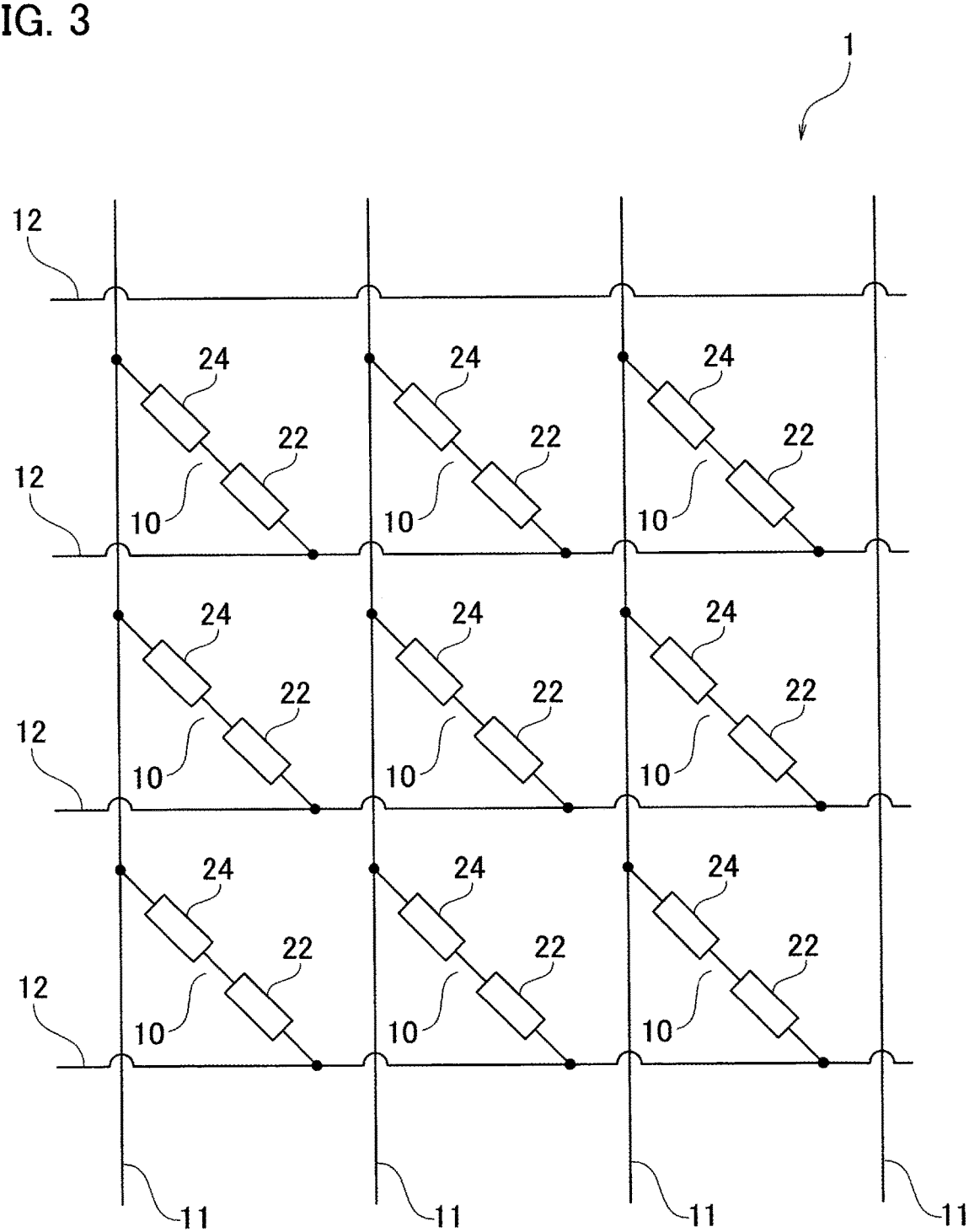
FIG. 3 is a circuit configuration diagram of the nonvolatile semiconductor memory device according to the embodiments.

In the basic circuit configuration of the nonvolatile semiconductor memory device 1 according to the embodiments, as illustrated in FIG. 3, the memory cell 10 is connected to the cross-point between the first wiring layer 11 and the second wiring layer 12. In FIG. 3, the memory cell 10 is expressed as a serial structure of the variable resistance film 24 and the selector 22. Since the nonvolatile semiconductor memory device 1 has a four-layer stacked structure as illustrated in FIG. 1, for example, the circuit configuration illustrated in FIG. 3 is stacked in four layers, in this case.

Figure 4:
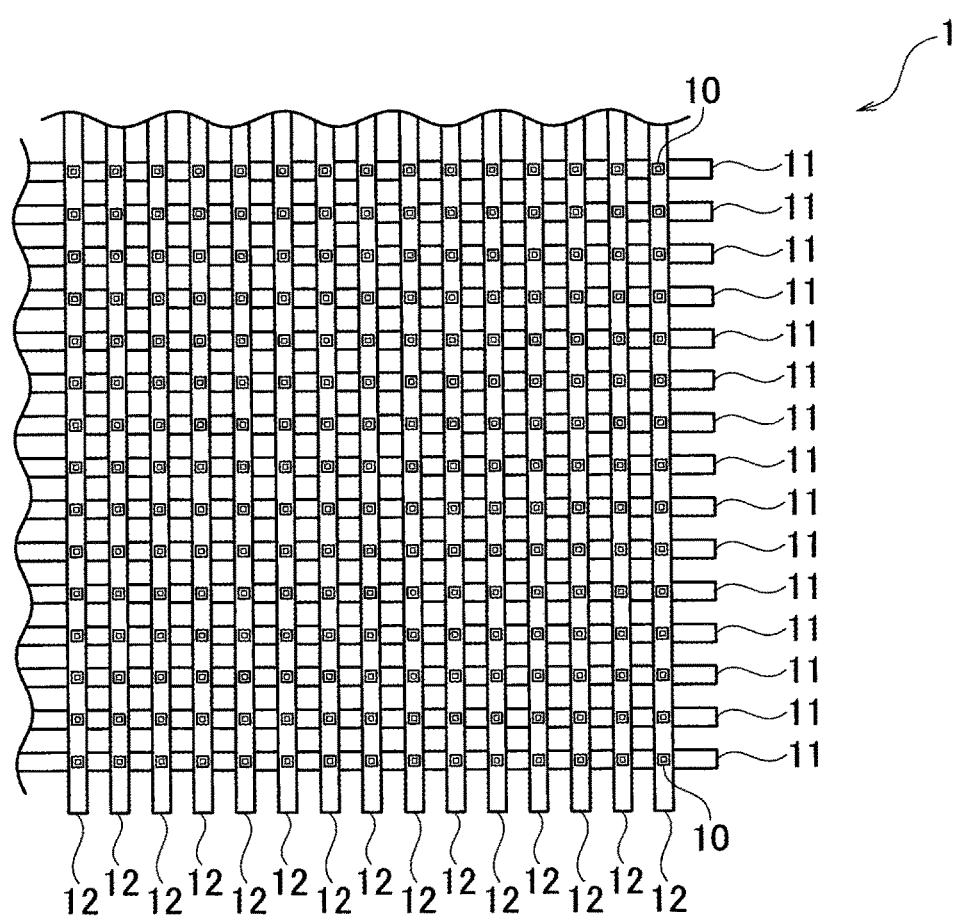
FIG. 4 is a schematic planar pattern configuration diagram of the nonvolatile semiconductor memory device according to the embodiments.

As illustrated in FIG. 4, an example of a schematic planar pattern configuration of the nonvolatile semiconductor memory device 1 according to the embodiments includes a plurality of first wiring layers (e.g., bit line) 11, a plurality of second wiring layers (e.g., word line) 12, and memory cells 10 respectively disposed at a cross-point between the plurality of bit lines 11 and the plurality of word lines 12. The configuration shown in FIG. 4 is an example in which the memory cells 10 are disposed in one layer.

(First Comparative Example: Configuration of One-Layered Memory Cell)

Figure 5:
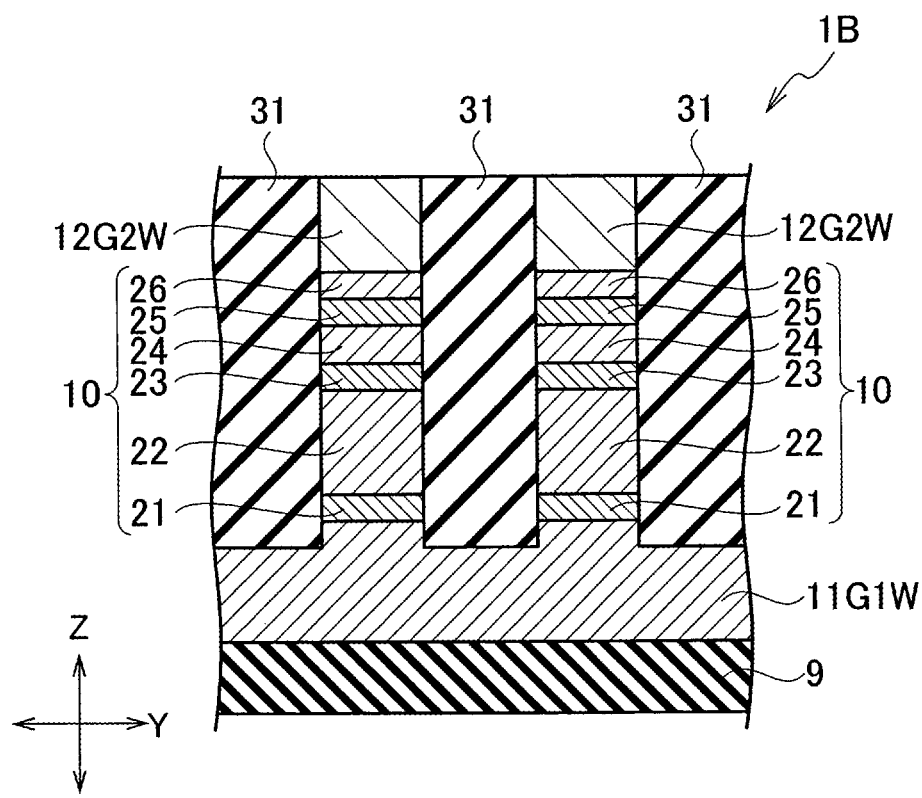
FIG. 5 is a schematic cross-sectional structure diagram of a nonvolatile semiconductor memory device according to a first comparative example.

As illustrated in FIG. 5, a nonvolatile semiconductor memory device 1B according to a first comparative example includes a plurality of first wiring layers 11G1W, a plurality of second wiring layers 12G2W, and memory cells 10, and is disposed on an insulating substrate 9 including an insulation layer formed on the semiconductor substrate, for example. The plurality of first wiring layers 11G1W are extended in the Y direction. The plurality of second wiring layers 12G2W are extended in the X direction crossing the Y direction above the plurality of first wiring layers 11G1W. At each of the crossing portions between the plurality of second wiring layers 12G2W and the plurality of first wiring layers 11G1W, the memory cell 10 is disposed between the second wiring layer 12G2W and the first wiring layer 11G1W.

In the nonvolatile semiconductor memory device 1B according to the first comparative example, the first wiring layer 11G1W and the second wiring layer 12G2W comprise the same material, e.g., W. If the same dry etching gas is used for the fabrication process of the second wiring layer 12G2W and the subsequent fabrication process of the stacked films (21, 22, 23, 24, 25, 26), the first wiring layer 11G1W at the bottom of the trench is etched, as illustrated in FIG. 5. Therefore, increase of the wiring sheet resistance is caused.

(First Embodiment: Configuration of One-Layered Memory Cell)

Figure 6:
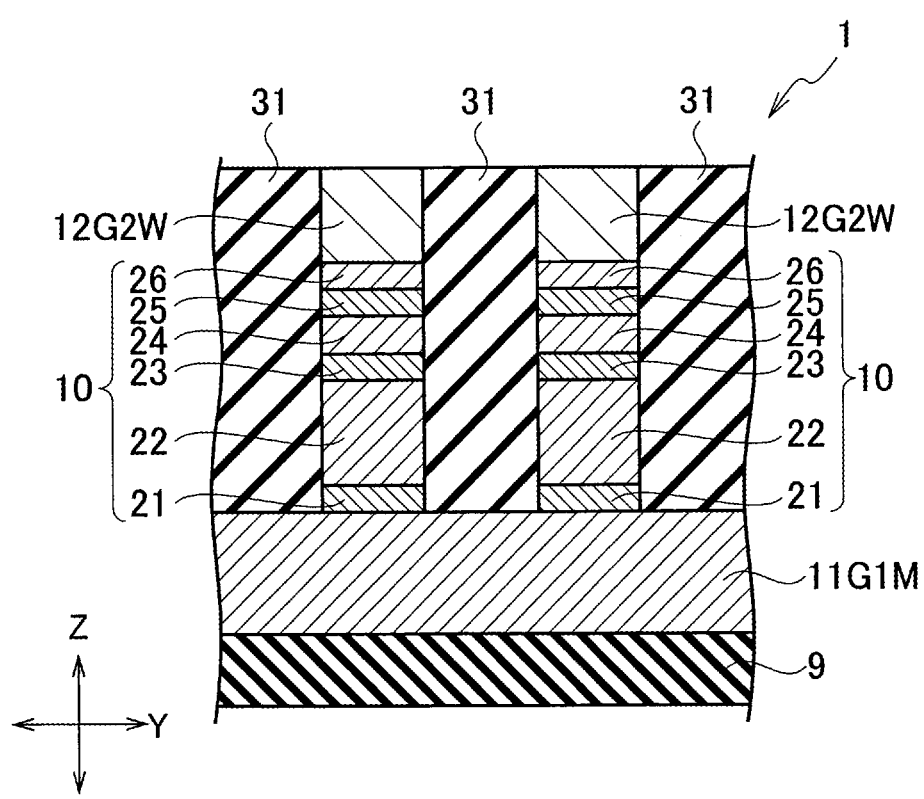
FIG. 6 is a schematic cross-sectional structure diagram of a nonvolatile semiconductor memory device according to a first embodiment.

As illustrated in FIG. 6, a nonvolatile semiconductor memory device 1 according to a first embodiment includes a plurality of first wiring layers 11G1M, a plurality of second wiring layers 12G2W, and memory cells 10, and is disposed on an insulating substrate 9 including an insulation layer formed on the semiconductor substrate, for example. The plurality of first wiring layers 11G1M are extended in the Y direction. The plurality of second wiring layers 12G2W are respectively extended in the X direction crossing the Y direction above the plurality of first wiring layers 11G1M. At each of the crossing portions between the plurality of second wiring layers 12G2W and the plurality of first wiring layers 11G1M, the memory cell 10 is disposed between the second wiring layer 12G2W and the first wiring layer 11G1M. The memory cell 10 includes a cell unit and a selector unit. The cell unit includes a variable resistance film 24. The selector unit includes a selector 22 and is connected in series to the cell unit. In FIG. 6, interlayer insulating films 31 are respectively disposed between the plurality of first wiring layers 11G1M and the plurality of second wiring layers 12G2W. As a material of the interlayer insulating film 31, not only $SiO_2$ but also SiO, SiOC, SiON, or the like can be applied.

In the nonvolatile semiconductor memory device 1 according to the first embodiment, the first wiring layer 11G1M and the second wiring layer 12G2W include different materials from each other. For example, the first wiring layer 11G1M includes Mo, and the second wiring layer 12G2W includes W. In the nonvolatile semiconductor memory device 1 according to the first embodiment, different dry etching gases are respectively used for processing of the first wiring layer 11G1M and processing of the second wiring layer 12G2W. An etching rate of the first wiring layer 11G1M is lower than an etching rate of the second wiring layer 12G2W. Therefore, as illustrated in FIG. 6, the first wiring layer 11G1M at the bottom of the trench is hard to be etched.

The different dry etching gases are respectively used for the processing of the first wiring layer 11G1M and the processing of the second wiring layer 12G2W, and thereby a difference in etching rate can be provided and increase the sheet resistance can be suppressed.

(Selection of Wiring Materials)

The material of the first wiring layer 11G1M and the material of the second wiring layer 12G2W may be selected, differently from each other or in different mixture ratios from each other, from any material, any silicide material, or any nitride selectable from the group including W, Mo, polysilicon, Ni, Co, Ti, and Cu.

As the silicide materials, NiSi, CoSi, WSi, and TiSi can be applied, for example. The mixture ratios of different materials includes Ni:Si=1:1, Ni:Si=0.5:1, or the like, for example.

(Relationship between Wiring Sheet Resistance and Wiring Width: Mo, W)

Figure 7:
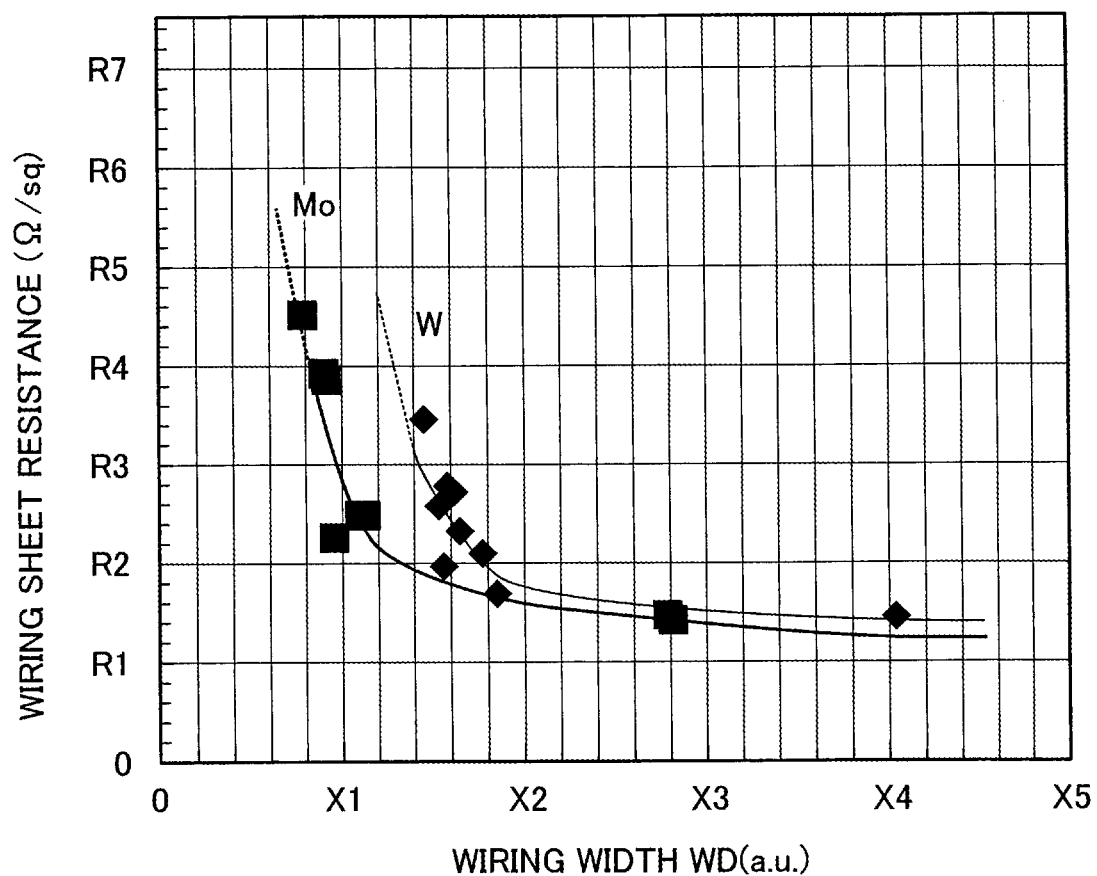
FIG. 7 is a schematic diagram illustrating a relationship of a wiring sheet resistance (Q/sq) and a wiring width WD (a.u.) as an example of tungsten and molybdenum, as a combination of wiring materials applicable to the nonvolatile semiconductor memory device according to the first embodiment.

FIG. 7 schematically illustrates, a relationship between a wiring sheet resistance (Ω/sq) and a wiring width WD (a. u.)

as an example of W and Mo, as a combination of wiring materials applicable to the nonvolatile semiconductor memory device according to the first embodiment. When the wiring width WD (a. u.)=X2, W wiring and Mo wiring have substantially the same value in terms of sheet resistance.
(Dry Etching Gas Series)

As dry etching gas (i.e., etchant) when forming the W wiring by Reactive Ion Etching (RIE), $CF_4/O_2$ can be applied, for example. As the etchant when forming the Mo wiring by the RIE, HBr or Bromotrifluoromethane ($CBrF_3$) can be applied, for example. By using Bromotrifluoromethane ($CBrF_3$), etching of Mo is easy compared with etching of W. As another etchant for forming the Mo wiring, $CCl_4$ or $SiCl_4/O_2/CHF_3$ can be applied.

A mixed gas of F or Cl-based halogen gas and $O_2$ gas can also applied, as an etchant applicable to etching of Mo, compared with W. When $O_2$ is contained in the etchant, there can be utilized a property that Mo can be oxidized more easily than W and the oxidation promotes etching. As the mixed gas of F or Cl-based halogen gas and $O_2$ gas, $CF_4/O_2$, $CHF_3/O_2$, $CH_2F_2/O_2$, $SF_6/O_2$, $Cl_2/O_2$, or the like are listed, for example.

F-based gas can also be applied for the etchant effective in etching of W, compared with etching of Mo. The metal electrode is mainly processed by chemical etching rather than physical etching, W-F is low in terms of vapor pressure, and therefore etching proceeds rather than Mo. W can be etched by using such a property.

According to the nonvolatile semiconductor memory device according to the first embodiment, the wiring layer opposite to each other at the cross-point so as to sandwich the one-layered memory cell structure include materials different from each other, and thereby the lower wiring layer is hardly to be etched when the upper wiring layer is processed. Accordingly, it is possible to provide the nonvolatile semiconductor memory device capable of avoiding increase of the wiring sheet resistance and reducing the wiring sheet resistance.
(Second Comparative Example: Configuration of Two-Layered Memory Cell)

Figure 8:
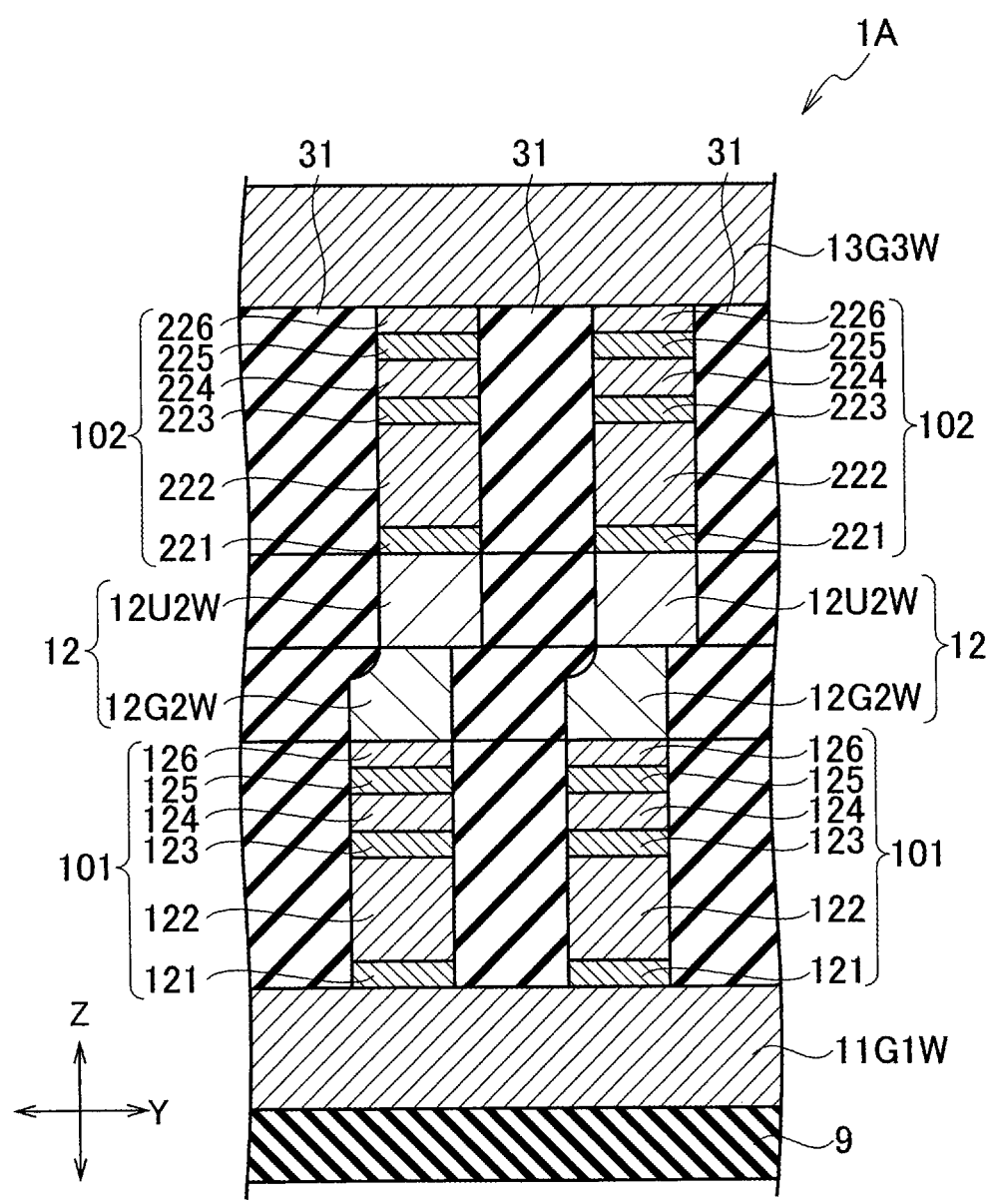
FIG. 8 is a schematic cross-sectional structure diagram of a nonvolatile semiconductor memory device according to a second comparative example.

FIG. 8 illustrates a schematic cross-sectional structure of a nonvolatile semiconductor memory device 1A according to a second comparative example. FIG. 8 corresponds to a schematic cross-sectional structure viewed from the Y-Z direction. In order to describe a two-layered memory cell structure, the same memory cells 10 are denoted as a first memory cell 101 and a second memory cell 102 in FIG. 8. Moreover, although stacked films of the first memory cell 101 is denoted as stacked films (121, 122, 123, 124, 125, 126) and stacked films of the second memory cell 102 is denoted as stacked films (221, 222, 223, 224, 225, 226), each layer corresponds to the stacked film (21, 22, 23, 24, 25, 26) similar to FIG. 2 and is provided with the same stacked film structure. The same applies hereafter.

As illustrated in FIG. 8, a nonvolatile semiconductor memory device 1A according to the second comparative example includes a plurality of first wiring layers 11G1W, a plurality of second wiring layers 12, and memory cells 101. The plurality of first wiring layers 11G1W are extended in the Y direction. The plurality of second wiring layers 12 are extended in the X direction crossing the Y direction above the plurality of first wiring layers 11G1W. At each of the crossing portions between the plurality of second wiring layers 12 and the plurality of first wiring layers 11G1W, the first memory cell 101 is disposed between the second wiring layer 12 and the first wiring layer 11G1W. The first wiring layer 11G1W and the second wiring layer 12 include the same material, e.g., W.

Furthermore, the nonvolatile semiconductor memory device 1A according to the second comparative example includes a plurality of third wiring layers 13G3W and second memory cells 102, as illustrated in FIG. 8. A plurality of third wiring layers 13G3W are extended in the Y direction above the plurality of second wiring layers 12. At each of the crossing portions between the plurality of third wiring layers 13G3W and the plurality of second wiring layers 12, the second memory cell 102 is disposed between the third wiring layer 13G3W and the second wiring layer 12. The third wiring layer 13G3W and the second wiring layer 12 include the same material, e.g., W.

The second wiring layer 12 includes a stacked structure including a second lower wiring layer 12G2W connected to the first memory cell 101, and a second upper wiring layer 12U2W connected to the second memory cell 102, as illustrated in FIG. 8. The second lower wiring layer 12G2W and the second upper wiring layer 12U2W include the same material, e.g., W.

When the second lower wiring layer 12G2W and the second upper wiring layer 12U2W are composed of the same material, e.g., W, the W wiring (i.e., second lower wiring layer 12G2W) formed earlier is etched at the RIE step of the W wiring (i.e., second upper wiring layer 12U2W) formed later, as illustrated in FIG. 8. Therefore, the sheet resistance of the whole second wiring layer 12 (12G2W and 12U2W) is increased. For example, if the W wiring having a thickness of 50 nm is etched by 10 nm, the sheet resistance is increased by 20%. Actually, the sheet resistance is increased by several % to approximately 30%.
(Second Embodiment: Two-Layered Memory Cell Configuration)

Figure 9:
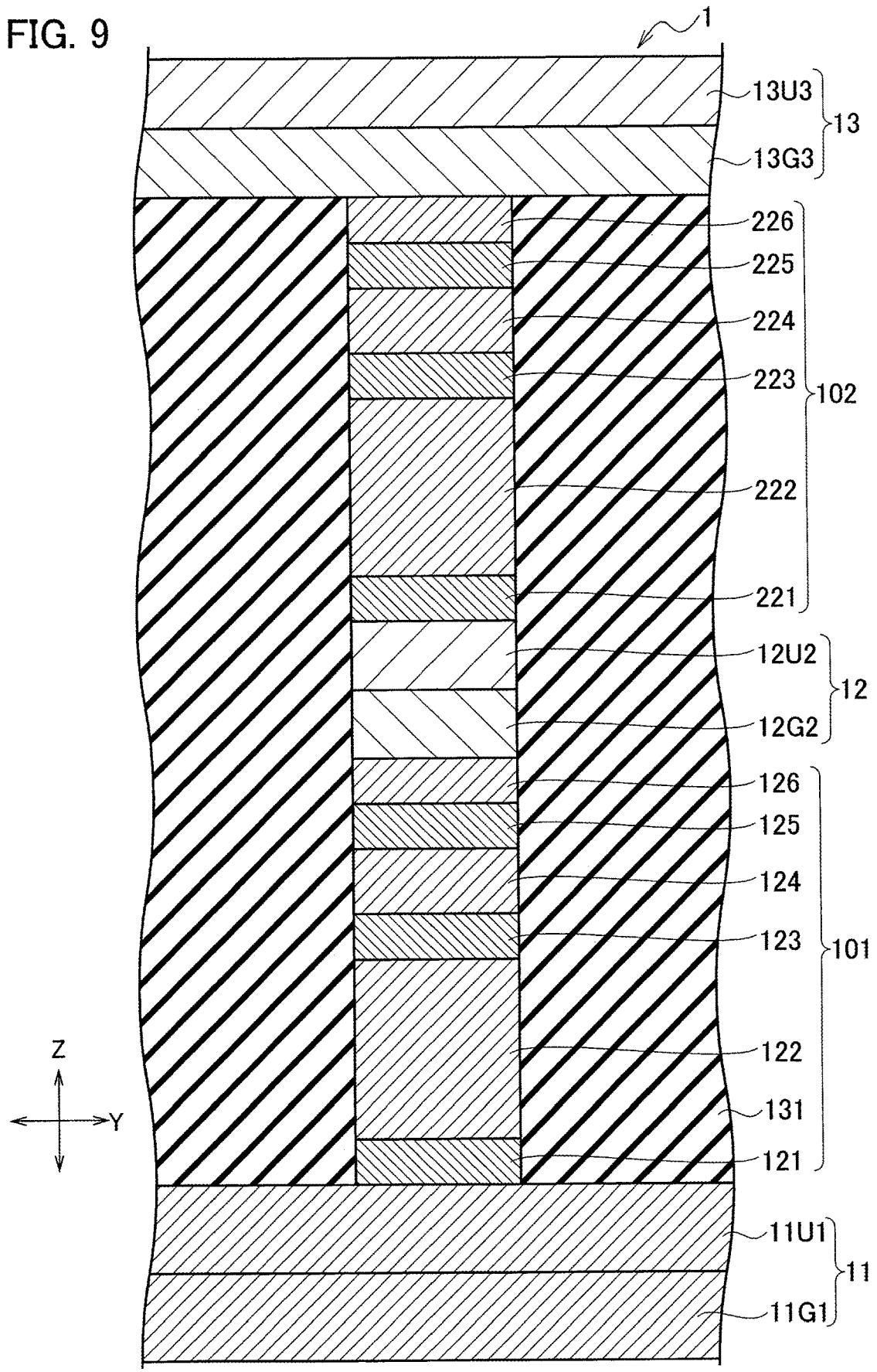
FIG. 9 is a schematic cross-sectional structure diagram of a two-stage configuration portion of the memory cell in a nonvolatile semiconductor memory device according to the second embodiment.

FIG. 9 illustrates a schematic cross-sectional structure of a two-stage configuration portion of memory cells in a nonvolatile semiconductor memory device according to a second embodiment. FIG. 9 corresponds to a schematic cross-sectional structure viewed from the Y-Z direction in FIG. 2.

As illustrated in FIG. 9, the nonvolatile semiconductor memory device 1 according to the second embodiment includes a plurality of first wiring layers 11, a plurality of second wiring layers 12, and first memory cells 101. The plurality of first wiring layers 11 are extended in the Y direction. The plurality of second wiring layers 12 are extended in the X direction crossing the Y direction above the plurality of first wiring layers 11. At each of the crossing portions between the plurality of second wiring layers 12 and the plurality of first wiring layers 11, the first memory cell 101 is disposed between the second wiring layer 12 and the first wiring layer 11. The first memory cell 101 includes a first cell unit and a first selector unit. The first cell unit includes a first variable resistance film 124. The first selector unit includes a first selector 122 and is connected in series to the first cell unit. In this case, the first wiring layer 11 and the second wiring layer 12 include materials different from each other.

In the nonvolatile semiconductor memory device 1 according to the second embodiment, different dry etching gases are respectively used for processing of the first wiring layer 11 and processing of the second wiring layer 12. The etching rate of the first wiring layer 11 is lower than the etching rate of the second wiring layer 12. The different dry etching gases are respectively used for the processing of the first wiring layer 11 and the processing of the second wiring layer 12, and thereby a difference in etching rate can be provided and increase the resistance can be suppressed.

Furthermore, the nonvolatile semiconductor memory device 1 according to the second embodiment includes a plurality of third wiring layers 13 and second memory cells 102, as illustrated in FIG. 9. A plurality of third wiring layers 13 are extended in the Y direction above the plurality of second wiring layers 12. At each of the crossing portions between the plurality of third wiring layers 13 and the plurality of second wiring layers 12, the second memory cell 102 is disposed between the third wiring layer 13 and the second wiring layer 12. The second memory cell 102 includes a second cell unit and a second selector unit. The second cell unit includes a second variable resistance film 224. The second selector unit includes a second selector 222 and is connected in series to the second cell unit. In this case, the second wiring layer 12 and the third wiring layer 13 include materials different from each other.

In the nonvolatile semiconductor memory device 1 according to the second embodiment, different dry etching gases are respectively used for processing of the second wiring layer 12 and processing of the third wiring layer 13. The etching rate of the second wiring layer 12 is lower than the etching rate of the third wiring layer 13. The different dry etching gases are respectively used for the processing of the second wiring layer 12 and the processing of the third wiring layer 13, and thereby a difference in etching rate can be provided and increase the resistance can be suppressed.

Furthermore, the second wiring layer 12 may include a stacked structure of at least two layers having materials different from each other. When the memory cell configuration has at least two layers, a middle second wiring layer 12 is preferably formed in a two-stage structure from the viewpoint of resistance reduction.

The second wiring layer 12 includes a stacked structure including a second lower wiring layer 12G2 connected to the first memory cell 101, and a second upper wiring layer 12U2 connected to the second memory cell 102, as illustrated in FIG. 9. In the nonvolatile semiconductor memory device 1 according to the second embodiment, different dry etching gases are respectively used for processing of the second lower wiring layer 12G2 and processing of the second upper wiring layer 12U2. An etching rate of the second lower wiring layer 12G2 is lower than an etching rate of the second upper wiring layer 12U2. The different dry etching gases are respectively used for the processing of the second lower wiring layer 12G2 and the processing of the second upper wiring layer 12U2, and thereby a difference in etching rate can be provided and increase the resistance can be suppressed.

Moreover, as illustrated in FIGS. 2 and 9, the first wiring layer 11 may include a double layered structure including a first lower wiring layer 11G1 and a first upper wiring layer 11U1. The third wiring layer 13 may include a double layered structure including a third lower wiring layer 13G3 and a third upper wiring layer 13U3.

(Wiring Materials)

The second upper wiring layer 12U2 and the second lower wiring layer 12G2 include materials different from each other; and the material of the second upper wiring layer 12U2 and the material of the second lower wiring layer 12G2 are selected, differently from each other or in different mixture ratios from each other, from any material, any silicide material, or any nitride selectable from the group including W, Mo, polysilicon, Ni, Co, Ti, and Cu, for example.

The material of the first upper wiring layer 11U1 and the material of the second lower wiring layer 12G2 are selected, differently from each other or in different mixture ratios from each other, from any material, any silicide material, or any nitride selectable from the group including W, Mo, polysilicon, Ni, Co, Ti, and Cu.

The material of the second upper wiring layer 12U2 and the material of the third lower wiring layer 13G3 are similarly selected, differently from each other or in different mixture ratios from each other, from any material, any silicide material, or any nitride selectable from the group including W, Mo, polysilicon, Ni, Co, Ti, and Cu.

According to the nonvolatile semiconductor memory device according to the second embodiment, the upper wiring layer and the lower wiring layer at the middle portion of the two-layered memory cell structure include materials different from each other, and thereby, the lower wiring layer is hardly to be etched when the upper wiring layer is processed. Accordingly, it is possible to provide the nonvolatile semiconductor memory device capable of reducing the wiring sheet resistance.

Moreover, according to the nonvolatile semiconductor memory device according to the second embodiment, the wiring layer opposite to each other at the cross-point so as to sandwich the one-layered memory cell structure include materials different from each other, and thereby the lower wiring layer is hardly to be etched when the upper wiring layer is processed. Accordingly, it is possible to provide the nonvolatile semiconductor memory device capable of avoiding increase of the wiring sheet resistance and reducing the wiring sheet resistance.

(Third Embodiment: Two-Layered Memory Cell Configuration)

Figure 10:
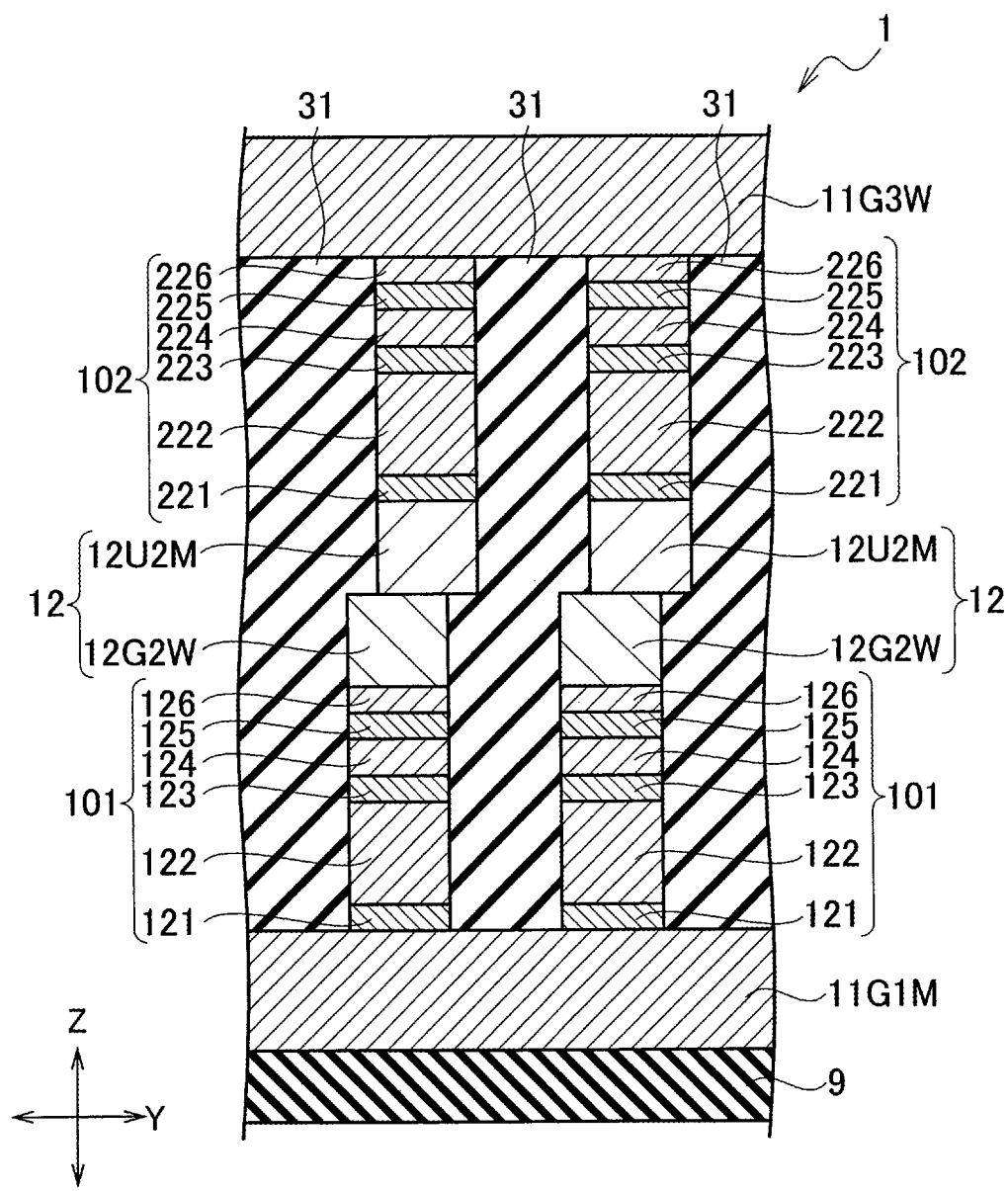
FIG. 10 is a schematic cross-sectional structure diagram of a nonvolatile semiconductor memory device according to a third embodiment.

As illustrated in FIG. 10, a nonvolatile semiconductor memory device 1 according to a third embodiment includes a first wiring layer 11G1M, a second lower wiring layer 12G2W, a second upper wiring layer 12U2M, and a third wiring layer 11G3W. The first wiring layer 11G1M is formed of Mo, the second lower wiring layer 12G2W is formed of W, the second upper wiring layer 12U2M is formed of Mo, and the third wiring layer 11G3W is formed of W.

In a fabrication method of the nonvolatile semiconductor memory device according to the third embodiment, different dry etching gases are respectively used for processing of the second upper wiring layer 12U2M and processing of the second lower wiring layer 12G2W.

In RIE processing of the second upper wiring layer 12U2M, the etching rate of the second lower wiring layer 12G2W is lower than the etching rate of the second upper wiring layer.

In the nonvolatile semiconductor memory device according to the third embodiment, since the second upper wiring layer 12U2M is formed of Mo and the second lower wiring layer 12G2W is formed of W, the W wiring (i.e., second lower wiring layer 12G2W) made earlier is not almost etched at the RIE step of the Mo wiring (i.e., second upper wiring layer 12U2M) made later. Therefore, increase of the sheet resistance of the second wiring layer (12G2W, 12U2M) can be avoided. The rest of the configuration is the same as that of the second embodiment.

(Fourth Embodiment: Two-Layered Memory Cell Configuration)

Figure 11:
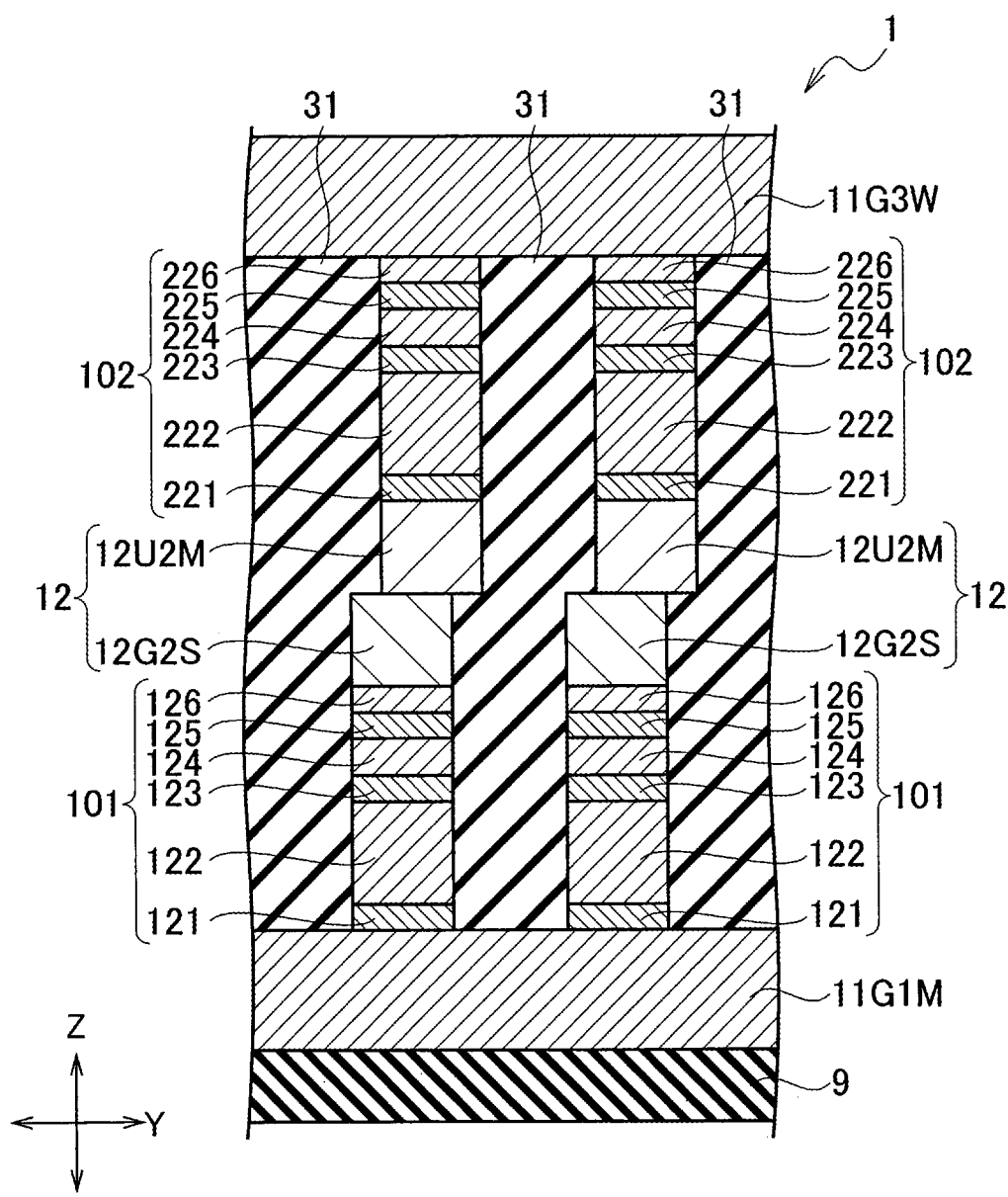
FIG. 11 is a schematic cross-sectional structure diagram of a nonvolatile semiconductor memory device according to a fourth embodiment.

As illustrated in FIG. 11, a nonvolatile semiconductor memory device 1 according to a fourth embodiment includes a first wiring layer 11G1M, a second lower wiring layer 12G2S, a second upper wiring layer 12U2M, and a third wiring layer 11G3W. The first wiring layer 11G1M is formed of Mo, the second lower wiring layer 12G2S is formed of a conductive stopper layer, the second upper wiring layer 12U2M is formed of Mo, and the third wiring layer 11G3W is formed of W.

In the nonvolatile semiconductor memory device according to the fourth embodiment, the second lower wiring layer 12G2S is used as a conductive stopper layer, not from the viewpoint of low resistance. Since the specific resistance of TiN is approximately 25 µΩcm, the specific resistance of W is approximately 5.65 µΩcm and the specific resistance of Mo is approximately 5.34 µΩcm, a conductive stopper layer composed of a metal layer having a specific resistance approximately 10 to approximately 100 times that of W, such as TiN wiring or Si-rich WSi, is applied to the second lower wiring layer 12G2S, for example.

Also in a fabrication method of the nonvolatile semiconductor memory device according to the fourth embodiment, different dry etching gases are respectively used for processing of the second upper wiring layer 12U2M and processing of the second lower wiring layer 12G2S.

Moreover, in RIE processing of the second upper wiring layer 12U2M, the etching rate of the second lower wiring layer 12G2S is lower than the etching rate of the second upper wiring layer.

In the nonvolatile semiconductor memory device according to the fourth embodiment, since the second upper wiring layer 12U2M is formed of Mo and the second lower wiring layer 12G2S is formed of TiN wiring, Si-rich WSi, or the like, the wiring (i.e., second lower wiring layer 12G2S) made earlier is not almost etched at the RIE step of the Mo wiring (i.e., second upper wiring layer 12U2M) made later. Therefore, increase of the sheet resistance of the second wiring layer (12G2S, 12U2M) can be avoidable. The rest of the configuration is the same as that of the second embodiment.

(Fifth Embodiment: Two-Layered Memory Cell Configuration)

Figure 12:
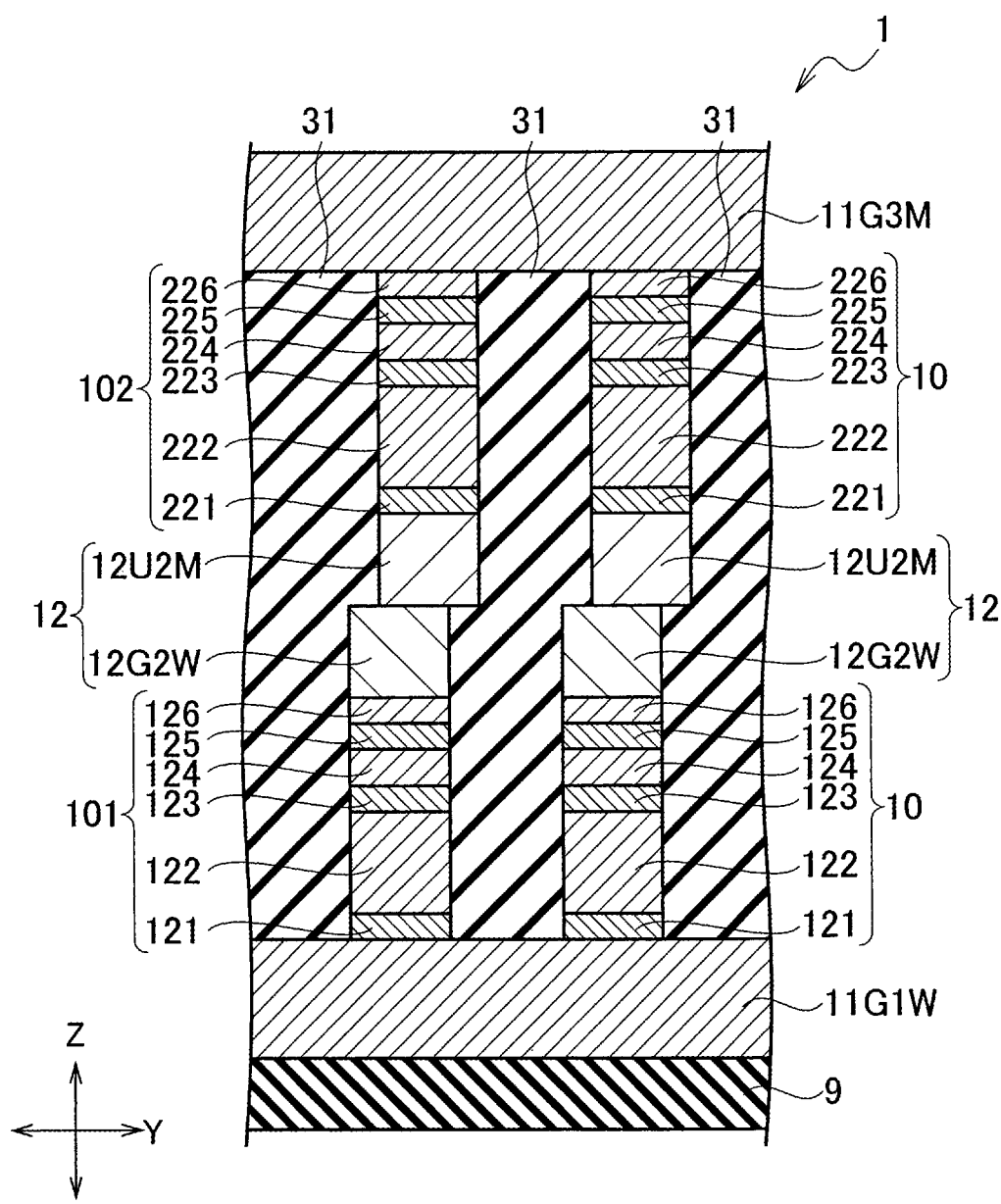
FIG. 12 is a schematic cross-sectional structure diagram of a nonvolatile semiconductor memory device according to a fifth embodiment.

As illustrated in FIG. 12, a nonvolatile semiconductor memory device 1 according to a fifth embodiment includes a first wiring layer 11G1W, a second lower wiring layer 12G2W, a second upper wiring layer 12U2M, and a third wiring layer 11G3M. The first wiring layer 11G1W is formed of W, the second lower wiring layer 12G2W is formed of W, the second upper wiring layer 12U2M is formed of Mo, and the third wiring layer 11G3M is formed of Mo.

Also in a fabrication method of the nonvolatile semiconductor memory device according to the fifth embodiment, different dry etching gases are respectively used for processing of the second upper wiring layer 12U2M and processing of the second lower wiring layer 12G2W.

Moreover, in the RIE processing of the second upper wiring layer 12U2M, the etching rate of the second lower wiring layer 12G2W is lower than the etching rate of the second upper wiring layer.

In the nonvolatile semiconductor memory device according to the fifth embodiment, since the second upper wiring layer 12U2M is formed of Mo and the second lower wiring layer 12G2W is formed of W, the second lower wiring layer 12G2W made earlier is not almost etched at the RIE step of the second upper wiring layer 12U2M made later. Therefore, increase of the sheet resistance of the second wiring layer (12G2W, 12U2M) can be avoided. The rest of the configuration is the same as that of the second embodiment.

(Sixth Embodiment: Two-Layered Memory Cell Configuration)

Figure 13:
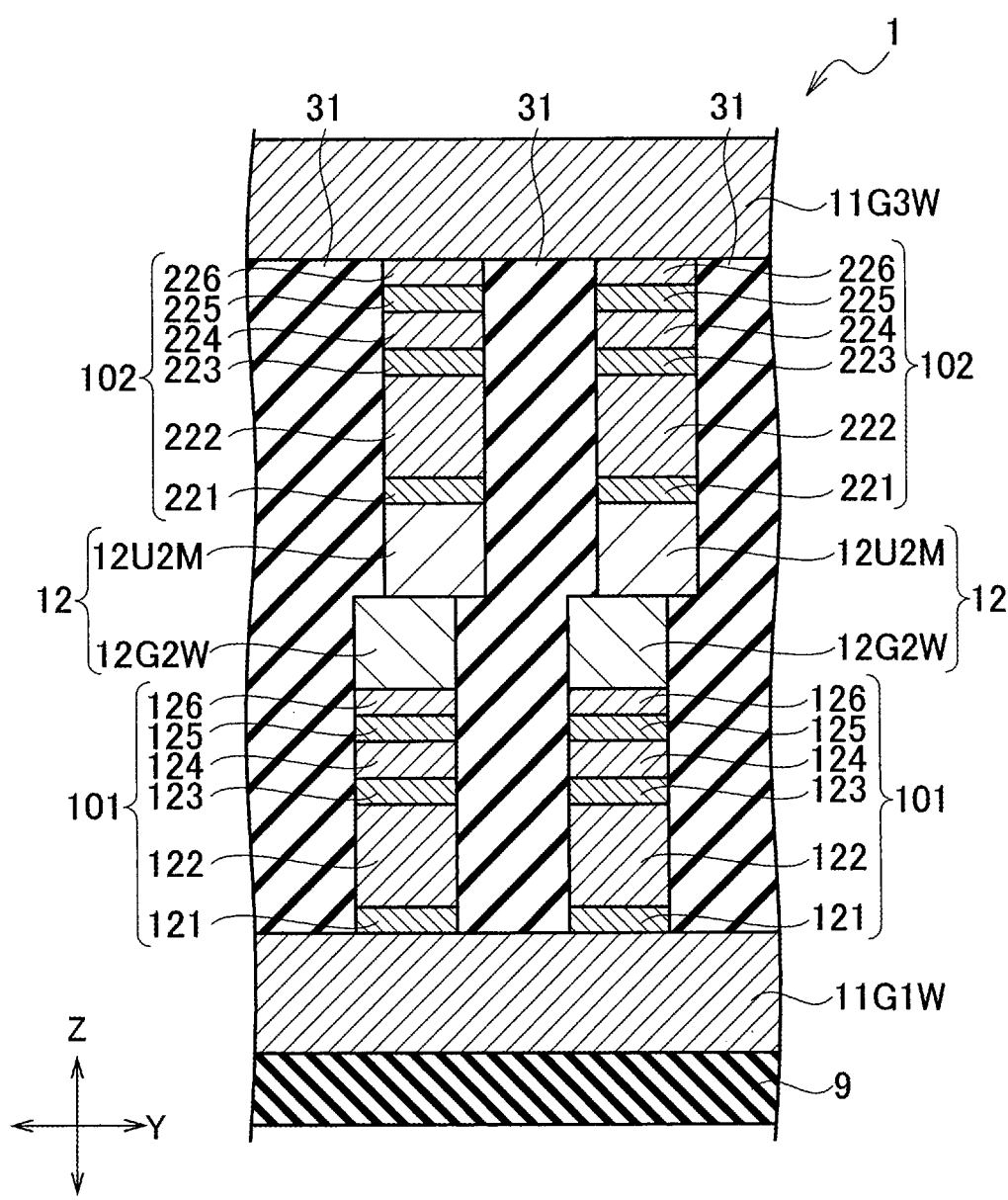
FIG. 13 is a schematic cross-sectional structure diagram of a nonvolatile semiconductor memory device according to a sixth embodiment.

As illustrated in FIG. 13, a nonvolatile semiconductor memory device 1 according to a sixth embodiment includes a first wiring layer 11G1W, a second lower wiring layer 12G2W, a second upper wiring layer 12U2M, and a third wiring layer 11G3W. The first wiring layer 11G1W is formed of W, the second lower wiring layer 12G2W is formed of W, the second upper wiring layer 12U2M is formed of Mo, and the third wiring layer 11G3W is formed of W. More specifically, only the second upper wiring layer 12U2M includes a material different from those of the first wiring layer 11G1W, the second lower wiring layer 12G2W, and the third wiring layer 11G3W.

Also in a fabrication method of the nonvolatile semiconductor memory device according to the sixth embodiment, different dry etching gases are respectively used for processing of the second upper wiring layer 12U2M and processing of the second lower wiring layer 12G2W.

Moreover, in the RIE processing of the second upper wiring layer 12U2M, the etching rate of the second lower wiring layer 12G2W is lower than the etching rate of the second upper wiring layer.

In the nonvolatile semiconductor memory device according to the sixth embodiment, since the second upper wiring layer 12U2M is formed of Mo and the second lower wiring layer 12G2W is formed of W, the second lower wiring layer 12G2W made earlier is not almost etched at the RIE step of the second upper wiring layer 12U2M made later. Therefore, increase of the sheet resistance of the second wiring layer (12G2W, 12U2M) can be avoided. The rest of the configuration is the same as that of the second embodiment.

According to the nonvolatile semiconductor memory device according to the sixth embodiment, the upper wiring layer and the lower wiring layer at the middle portion of the two-layered memory cell structure include materials different from each other, and thereby the lower wiring layer is hardly to be etched when the upper wiring layer is processed. Accordingly, it is possible to provide the nonvolatile semiconductor memory device capable of reducing the wiring sheet resistance. In addition, Mo and W may be replaced with each other, in the nonvolatile semiconductor memory device according to the sixth embodiment. In this case, a gas system is selected so that the Mo wiring (i.e., second lower wiring layer 12G2M) formed earlier is hardly etched by the RIE of the W wiring (i.e., second upper wiring layer 12U2W) formed later.

(Seventh Embodiment: Two-Layered Memory Cell Configuration)

Figure 14:
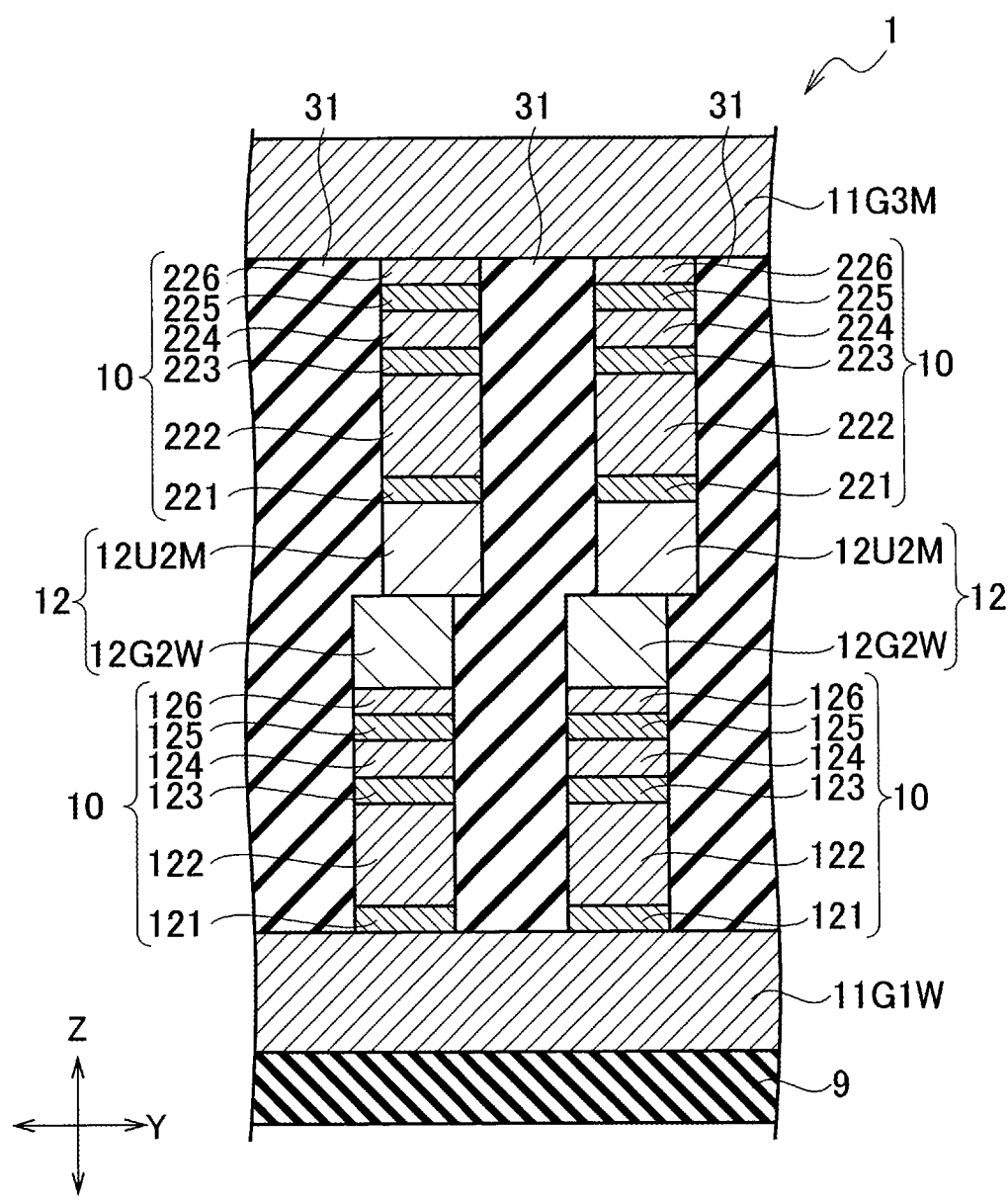
FIG. 14 is a schematic cross-sectional structure diagram of a nonvolatile semiconductor memory device according to a seventh embodiment.

As illustrated in FIG. 14, a nonvolatile semiconductor memory device 1 according to a seventh embodiment includes a first wiring layer 11G1W, a second lower wiring layer 12G2W, a second upper wiring layer 12U2M, and a third wiring layer 11G3M. The first wiring layer 11G1W is formed of W, the second lower wiring layer 12G2W is formed of W, the second upper wiring layer 12U2M is formed of Mo, and the third wiring layer 11G3M is formed of Mo. More specifically, the material of the second upper wiring layer 12U2M is different from the material of the second lower wiring layer 12G2W.

Also in a fabrication method of the nonvolatile semiconductor memory device according to the seventh embodiment, different dry etching gases are respectively used for processing of the second upper wiring layer 12U2M and processing of the second lower wiring layer 12G2W.

Moreover, in the RIE processing of the second upper wiring layer 12U2M, the etching rate of the second lower wiring layer 12G2W is lower than the etching rate of the second upper wiring layer.

In the nonvolatile semiconductor memory device according to the seventh embodiment, since the second upper wiring layer 12U2M is formed of Mo and the second lower wiring layer 12G2W is formed of W, the second lower wiring layer 12G2W made earlier is not almost etched at the RIE step of the second upper wiring layer 12U2M made later. Therefore, increase of the sheet resistance of the second wiring layer (12G2W, 12U2M) can be avoided. The rest of the configuration is the same as that of the second embodiment.

(Fabrication Method)
(First Fabrication Method: One-Layered Cell Structure)

Hereinafter, a first fabrication method of the nonvolatile semiconductor memory device 1 according to the first embodiment will be described with reference to FIGS. 15 to 21.

In the following description, the stacked films (21, 22, 23, 24, 25, 26) composing the memory cell 10, it may simply be referred to as a stacked film 10.

Figure 15A:
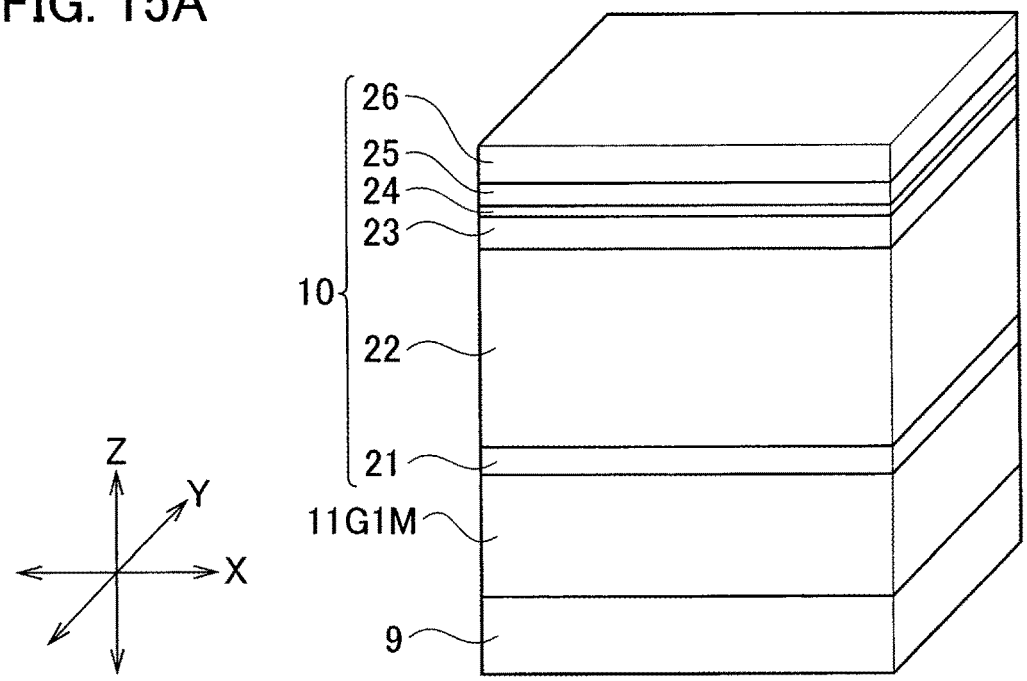
FIG. 15A is a schematic bird's-eye view configuration diagram for describing a first fabrication method of the nonvolatile semiconductor memory device according to the first embodiment, describing one process (Phase 1).
Figure 15B:
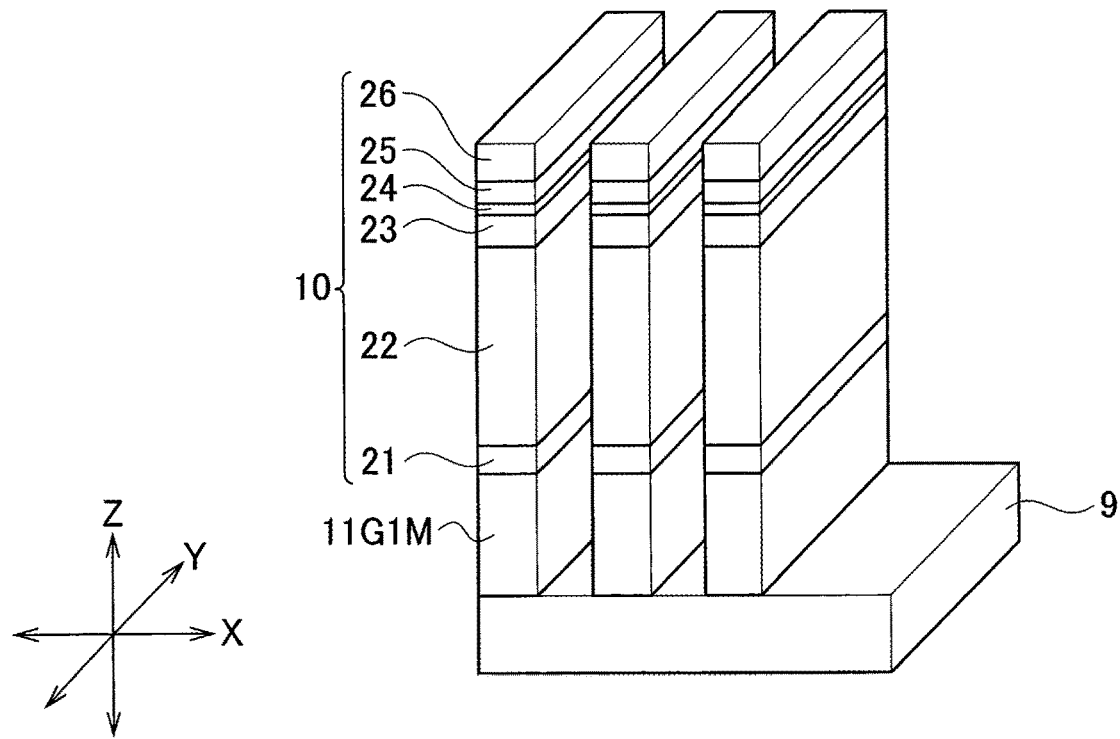
FIG. 15B is a schematic bird's-eye view configuration diagram for describing the first fabrication method of the nonvolatile semiconductor memory device according to the first embodiment, describing one process (Phase 2).
Figure 16A:
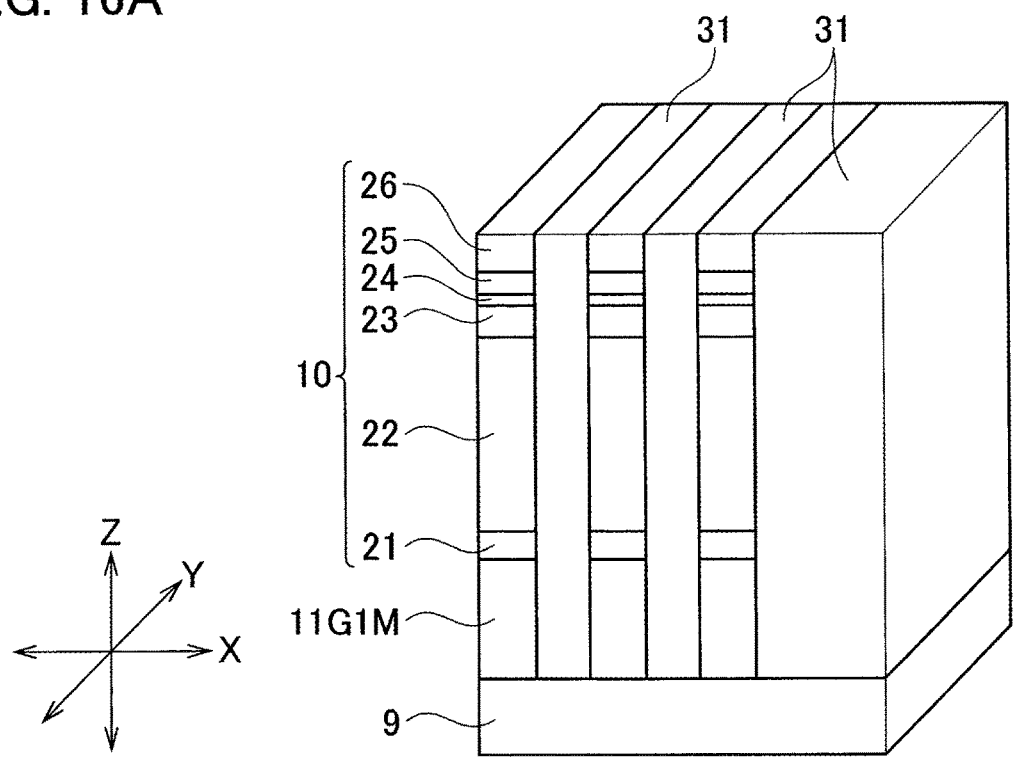
FIG. 16A is a schematic bird's-eye view configuration diagram for describing the first fabrication method of the nonvolatile semiconductor memory device according to the first embodiment, describing one process (Phase 3).
Figure 16B:
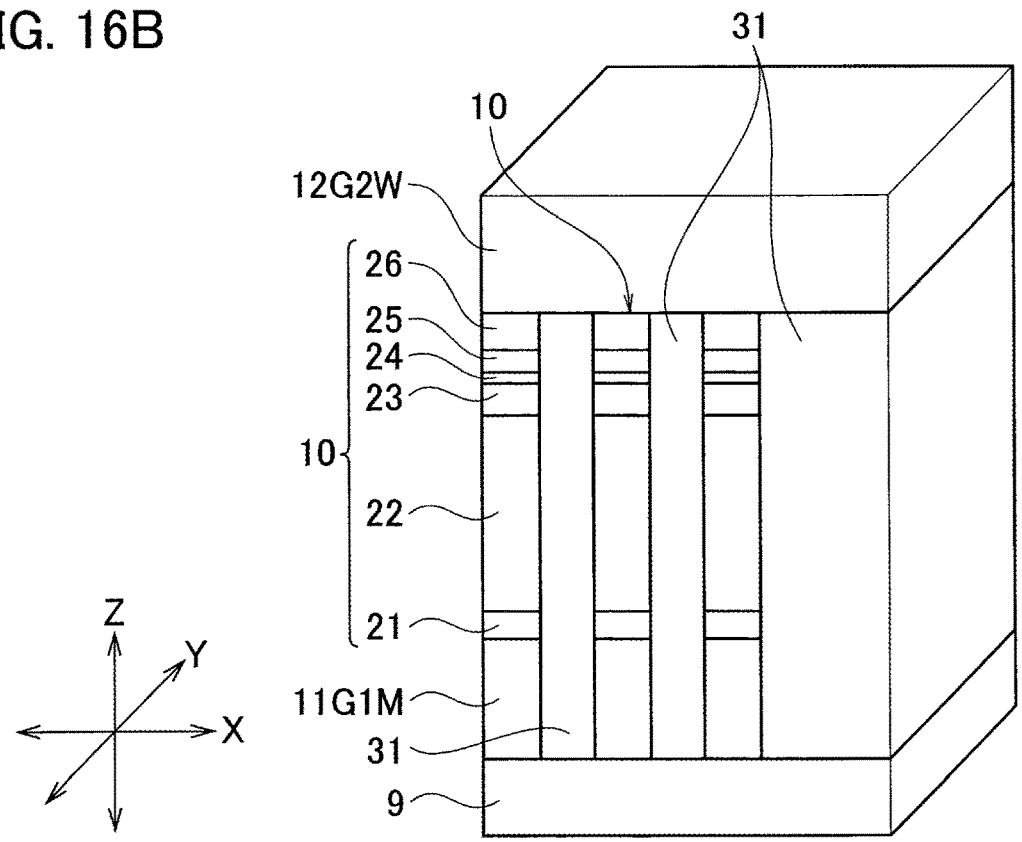
FIG. 16B is a schematic bird's-eye view configuration diagram for describing the first fabrication method of the nonvolatile semiconductor memory device according to the first embodiment, describing one process (Phase 4).
Figure 17:
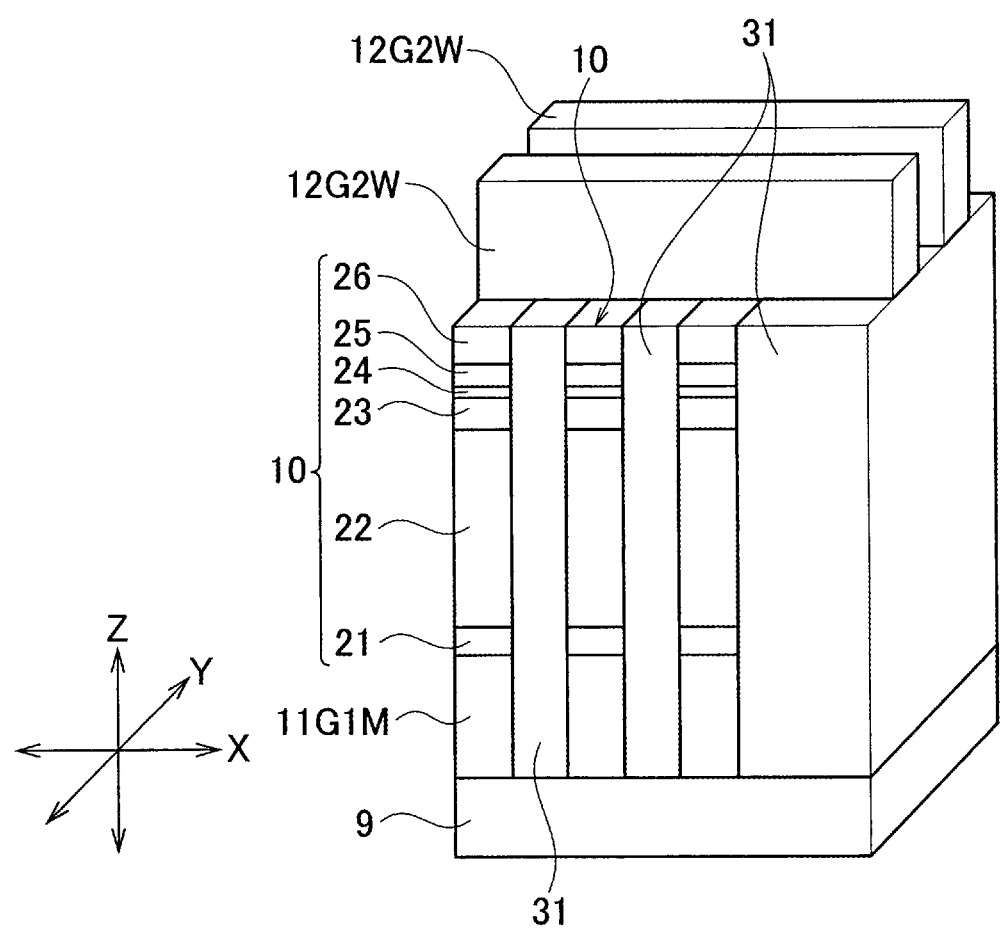
FIG. 17 is a schematic bird's-eye view configuration diagram for describing the first fabrication method of the nonvolatile semiconductor memory device according to the first embodiment, describing one process (Phase 5).
Figure 18:
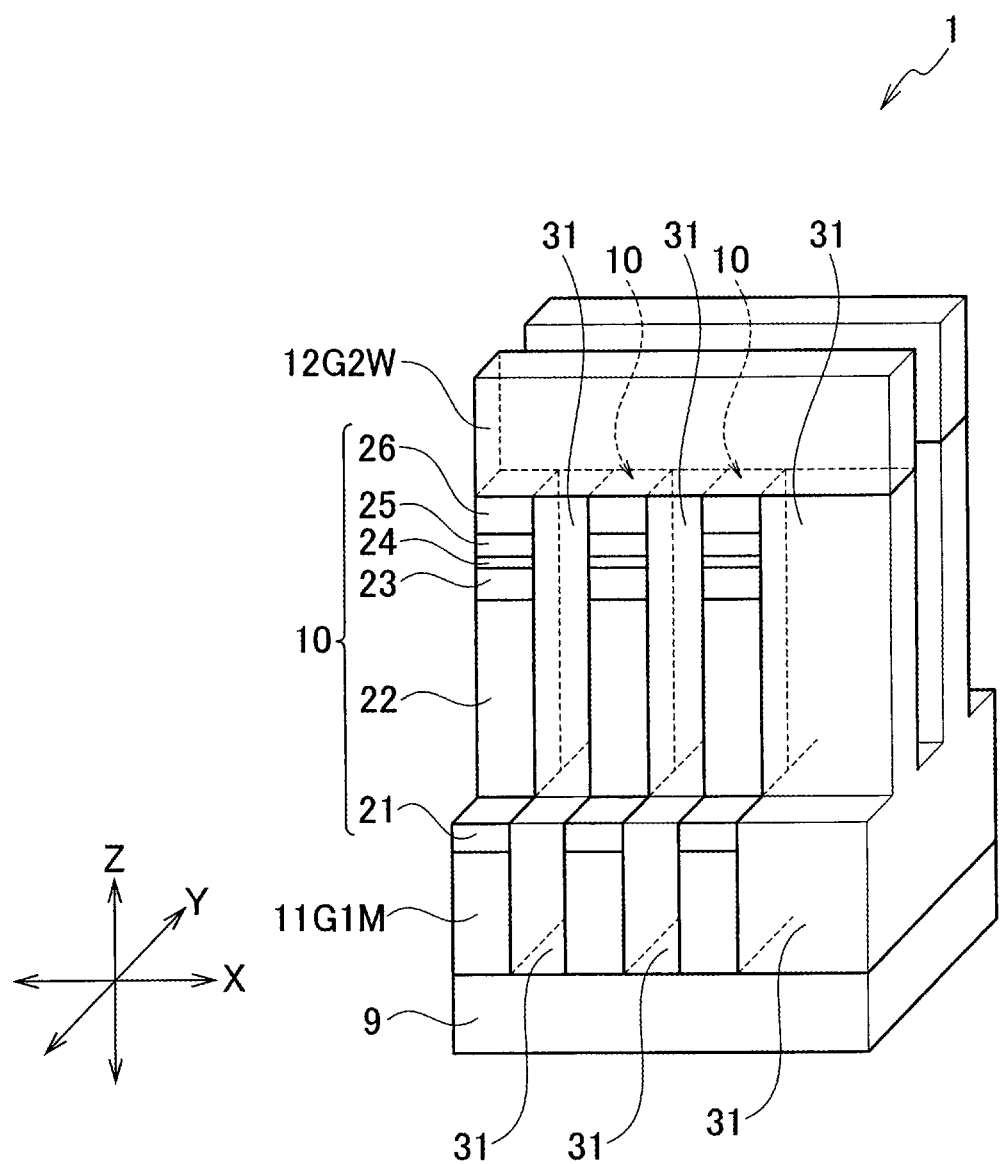
FIG. 18 is a schematic bird's-eye view configuration diagram for describing the nonvolatile semiconductor memory device according to the first embodiment and the first fabrication method thereof, describing one process (Phase 6).

The first fabrication method includes, after stacking a stacked film 10 on a first wiring layer 11G1M formed on an insulating substrate 9 as illustrated in FIG. 15A, processing the stacked film 10 in a fin shape which extends in the Y direction as illustrated in FIG. 15B. Next, the first fabrication method includes forming an interlayer insulating film 31 so as to be planarized as illustrated in FIG. 16A. Next, the first fabrication method includes, after forming a second wiring layer 12G2W having a material different from that of the first wiring layer 11G1M as illustrated in FIG. 16B, forming the second wiring layer 12G2W so as to be overlapped on the stacked film 10 by processing the second wiring layer 12G2W in a line shape to be extended in a second direction as illustrated in FIG. 17. Next, the first fabrication method includes forming a memory cell 10 having a pillar-shaped stacked film by processing the stacked film 10 and the interlayer insulating film 31 under between the second wiring layers 12G2W, as illustrated in FIG. 18. The details will be described below.

(a) First, as illustrated in FIG. 15A, after forming the first wiring layer 11G1M on the insulating substrate 9, the stacked films (21, 22, 23, 24, 25, 26) composing the memory cell 10 are stacked on the first wiring layer 11G1M. More specifically, the conductive film 21, the selector 22, the conductive film 23, the variable resistance film. 24, the conductive film 25, and the electrode layer 26 are formed in order on the first wiring layer 11G1M.

(b) Next, as illustrated in FIG. 15B, the stacked film 10 and the first wiring layer 11G1M are simultaneously process in a fin shape to be extended in the Y direction by means of a Reactive Ion Etching (RIE) method. The plurality of first wiring layer 11G1M and the plurality of stacked films 10 respectively formed on the first wiring layers 11G1M are arranged in the X direction which is orthogonal to the Y direction so as to sandwich a trench.

(c) Next, as illustrated in FIG. 16A, the interlayer insulating films 31 are formed therebetween and are planarized using a Chemical Mechanical Polishing (CMP) technology or the like. Consequently, the interlayer insulating film 31 is embedded into the trench between the stacked films 10 formed by the processing.

The interlayer insulating film 31 is disposed in the region between the first wiring layers 11G1M adjacent to each other in the X direction, and is disposed in the region between the stacked films 10 adjacent to each other in the X direction. The interlayer insulating film 31 may be embedded via a liner film (not illustrated). The liner film is conformally formed, before forming the interlayer insulating film 31.

As the interlayer insulating film 31, a silicon oxide film or a silicon nitride film is formed by means of an Atomic Layer Deposition (ALD) method, a low-pressure Chemical Vapor Deposition (CVD), a flowable CVD method, or the like, for example.

The flowable CVD method is a kind of the plasma CVD method, and forms an SiOxNxHx film having flowability similar to a fluid by mixing impurities under a temperature of approximately 400° C., for example. Then, for example, by being baked in an $O_3$ atmosphere at approximately 200° C. or by being subjected to water vapor gas processing under a temperature of approximately 350° C., $NH_3$ (gas) is extracted from the SiOxNxHx film to form SiO (e.g., silicon oxide film).

For example, the first wiring layer 11G1M is formed of Mo, and the electrode layer 26 is formed of W, and the interlayer insulating film 31 can be formed of a silicon oxide film. The interlayer insulating film 31 may be formed in multilayers.

The interlayer insulating film 31 may include a silicon oxide film formed by means of a plasma Chemical Vapor Deposition (CVD) method, a low-pressure CVD method, an ALD method, a coating method, or the like, using material gas including TEOS (Tetraethyl orthosilicate, Tetraethoxysilane), for example.

Different kinds of films, e.g., a multilayer film including a silicon oxide film and a silicon nitride film, can be used for the interlayer insulating film 31. Alternatively, the same kind of a silicon oxide-based multilayer film can also be used for the interlayer insulating film 31, for example. Alternatively, a multilayer film of the same kind but different film quality can also be used for the interlayer insulating film 31.

For example, the silicon oxide film may contain hydrogen (H) caused by the material gas. Then, it is possible to control an amount of Si—H bond in the silicon oxide film in accordance with film formation methods or film formation conditions. Generally, a denser silicon oxide film tends to have a smaller amount of the Si—H bond. Accordingly, when the silicon oxide film is used as the interlayer insulating film 31, an etching rate can be controlled by controlling the amount of the Si—H bond in the interlayer insulating film to use a dense film, with respect to the RIE using a gas containing fluorocarbon ($C_4F_8$, $C_4F_6$, $CF_4$, or the like), for example.

While polishing and removing the interlayer insulating film 31 deposited above the stacked film 10 by means of the CMP method, for example, and the upper surface of the interlayer insulating film 31 is planarized. As illustrated in FIG. 16A, an upper surface of the electrode layer 26 is exposed.

(d) Next, as illustrated in FIG. 16B, the second wiring layer 12G2W having a material different from that of the first wiring layer 11G1M is formed: For example, the second wiring layer 12G2W is formed of W.

(e) Next, as illustrated in FIG. 17, the second wiring layer 12G2W is processed into a line shape to be extended in the X direction. Consequently, the second wiring layer 12G2W is connected to the electrode layer 26 of the memory cell 10.

The plurality of second wiring layers 12G2W are arranged in the Y direction with a gap therebetween, and an upper surface of the stacked film 10 (i.e., an upper surface of the electrode layer 26) and an upper surface of the interlayer insulating film 31 are exposed between the second wiring layers 12G2W adjacent to one another in the Y direction. The second wiring layer 12G2W is extended on the stacked film 10 in the X direction and also extended to the periphery.

(f) Next, as illustrated in FIG. 18, the stacked film 10 and also the interlayer insulating film 31 under between the second wiring layers 12G2W processed into the line shape are processed by the RIE method using a mask which is not illustrated, and thereby the first memory cell having the pillar-shaped stacked film 10 is formed at the crossing portion between the second wiring layer 12G2W and the first wiring layer 11G1M.

Different dry etching gases are respectively used for the processing of the first wiring layer 11G1M and the processing of the second wiring layer 12G2W. An etching rate of the first wiring layer 11G1M is lower than an etching rate of the second wiring layer 12G2W. The different dry etching gases are respectively used for the processing of the first wiring layer 11G1M and the processing of the second wiring layer 12G2W, and thereby a difference in etching rate can be provided and increase the resistance can be suppressed.

In this case, the RIE method using a gas containing fluorocarbon ($C_4F_8$, $C_4F_6$, $CF_4$, or the like) may be used for the etching of the stacked film 10 and the interlayer insulating film 31 under between the second wiring layers 12G2W, for example. The stacked film 10 and the interlayer insulating film 31 under between the second wiring layers 12G2W are simultaneously etched to be removed.

(Second Fabrication Method: One-Layered Cell Structure)

Hereinafter, a second fabrication method of the nonvolatile semiconductor memory device 1 according to the first embodiment will be described with reference to FIGS. 19 to 20.

Figure 19:
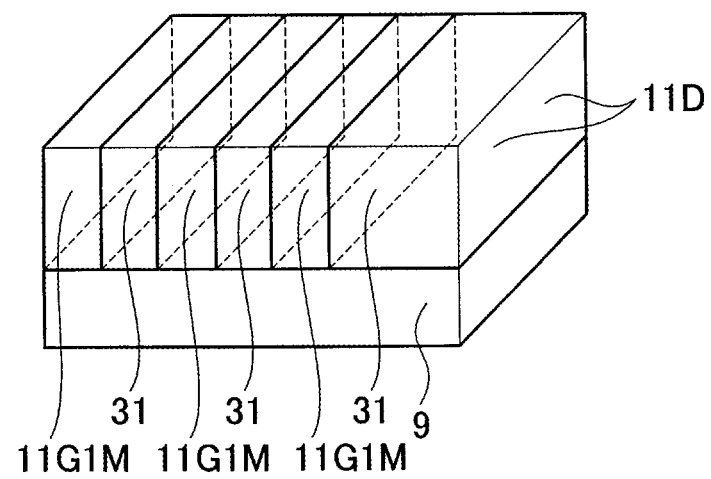
FIG. 19 is a schematic bird's-eye view configuration diagram for describing a second fabrication method of the nonvolatile semiconductor memory device according to the first embodiment, describing one process (Phase 1).
Figure 20A:
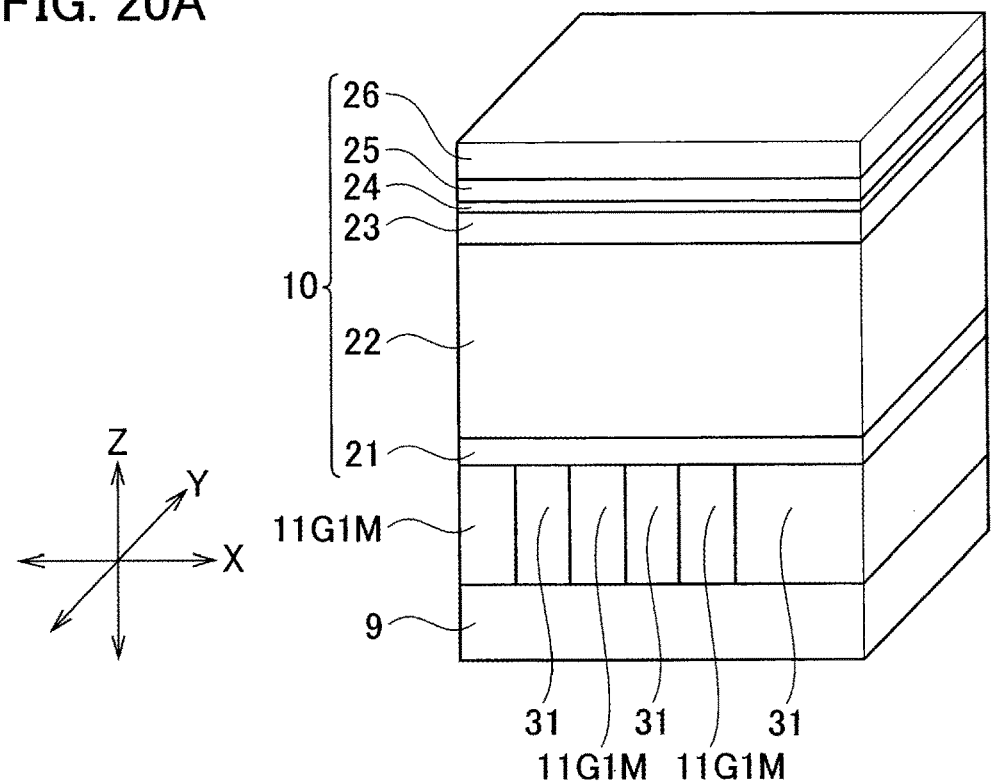
FIG. 20A is a schematic bird's-eye view configuration diagram for describing the second fabrication method of the nonvolatile semiconductor memory device according to the first embodiment, describing one process (Phase 2).
Figure 20B:
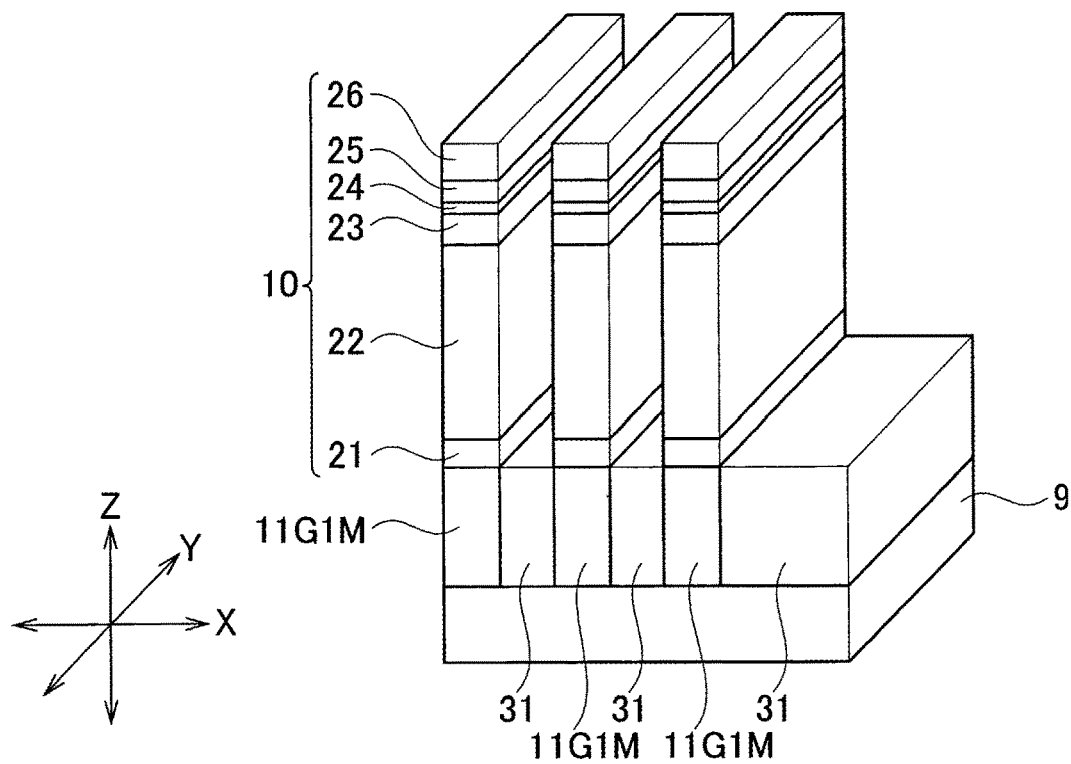
FIG. 20B is a schematic bird's-eye view configuration diagram for describing the second fabrication method of the nonvolatile semiconductor memory device according to the first embodiment, describing one process (Phase 3).

As illustrated in FIG. 19, the second fabrication method includes a step of pattern-forming a first wiring layer 11G1M on an insulating substrate 9 and then forming a first interlayer insulating film 31 so as to be planarized. Next, as illustrated in FIG. 20A, the second fabrication method includes a step of forming a stacked film 10 on the first wiring layer 11G1M and the interlayer insulating film 31. Next, as illustrated in FIG. 20B, the second fabrication method includes a step of processing the stacked film 10 on the first wiring layer 11G1M into a fin shape to be extended in the Y direction. Next, the second fabrication method includes forming a second interlayer insulating film 31 so as to be planarized, as in the case illustrated in FIG. 16A. Next, the second fabrication method includes, after forming a second wiring layer 12G2W having a material different from that of the first wiring layer 11G1M as in the case illustrated in FIG. 16B, forming the second wiring layer 12G2W so as to be overlapped on the stacked film 10 by processing the second wiring layer 12G2W in a line shape to be extended in a second direction as illustrated in FIG. 17. Next, the first fabrication method includes forming a memory cell 10 having a pillar-shaped stacked film by processing the stacked film 10 and the interlayer insulating film 31 under between the second wiring layers 12G2W, as illustrated in FIG. 18. The details will be described below.

(a) First, as illustrated in FIG. 19, after pattern-forming the first wiring layer 11G1M on the insulating substrate 9, the interlayer insulating film 31 is formed so as to be planarized using a CMP technique or the like. Consequently, the interlayer insulating film 31 is embedded between the pattern-formed first wiring layers 11G1M.

(b) Next, as illustrated in FIG. 20A, the stacked film 10 is formed. More specifically, a conductive film 21, a selector 22, a conductive film 23, a variable resistance film 24, a conductive film 25, and an electrode layer 26 are formed in order on the first wiring layer 11G1M and the interlayer insulating film 31.

(c) Next, as illustrated in FIG. 20B, the stacked film 10 and the interlayer insulating film 31 are processed by means of the RIE method or the like. As illustrated in FIG. 20B, the stacked film 10 formed on the first wiring layer 11G1M is processed into a fin shape to be extended in the Y direction.

The following steps are the same as those of the first fabrication method. More specifically, the nonvolatile semiconductor memory device 1 according to the first embodiment is formed in accordance with the steps illustrated in FIGS. 16 to 18.

(Third Fabrication Method: One-Layered Cell Structure)

Hereinafter, a third fabrication method of the nonvolatile semiconductor memory device 1 according to the first embodiment will be described with reference to FIG. 21.

As illustrated in FIG. 19, the third fabrication method includes a step of pattern-forming a first wiring layer 11G1M on an insulating substrate 9 and then forming a first interlayer insulating film 31 so as to be planarized. Next, as illustrated in FIG. 20A, the second fabrication method includes a step of forming a stacked film 10 on the first wiring layer 11G1M and the interlayer insulating film 31. Next, as illustrated in FIG. 20B, the third fabrication method includes a step of processing the stacked film 10 on the first wiring layer 11G1M into a fin shape to be extended in the Y direction. Next, the third fabrication method includes forming a second interlayer insulating film 31 so as to be planarized, as in the case illustrated in FIG. 16A. Next, as illustrated in FIG. 21, the third fabrication method includes a step of forming the pillar-shaped stacked film 10 by processing the stacked film 10 formed on the first wiring layer 11G1M in the X direction which crossing the Y direction. Next, the third fabrication method includes forming a third interlayer insulating film so as to be planarized. Next, the third fabrication method includes, after forming a second wiring layer 12G2W having a material different from that of the first wiring layer 11G1M as in the case illustrated in FIG. 16B, forming the second wiring layer 12G2W so as to be overlapped on the stacked film 10 by processing the second wiring layer 12G2W in a line shape to be extended in a second direction as in the case illustrated in FIG. 17. The details will be described below.

(a) First, as illustrated in FIG. 19, after pattern-forming the first wiring layer 11G1M on the insulating substrate 9, the interlayer insulating film 31 is formed so as to be planarized using a CMP technique or the like. Consequently, the interlayer insulating film 31 is embedded between the pattern-formed first wiring layers 11G1M.

(b) Next, as illustrated in FIG. 20A, the stacked film used as the memory cell 10 is formed. More specifically, a conductive film 21, a selector 22, a conductive film 23, a variable resistance film 24, a conductive film 25, and an electrode layer 26 are formed in order on the first wiring layer 11G1M and the interlayer insulating film 31.

(c) Next, as illustrated in FIG. 20B, the stacked film 10 and the interlayer insulating film 31 are processed by means of the RIE method or the like. The stacked film 10 formed on the first wiring layer 11G1M is processed into a fin shape to be extended in the Y direction.

(d) Next, as in the case illustrated in FIG. 16A, the interlayer insulating film 31 are formed so ad to be planarized by means of the CMP technique or the like. Consequently, the interlayer insulating film 31 is embedded into the trench between the stacked films 10 formed by the processing.

Figure 21:
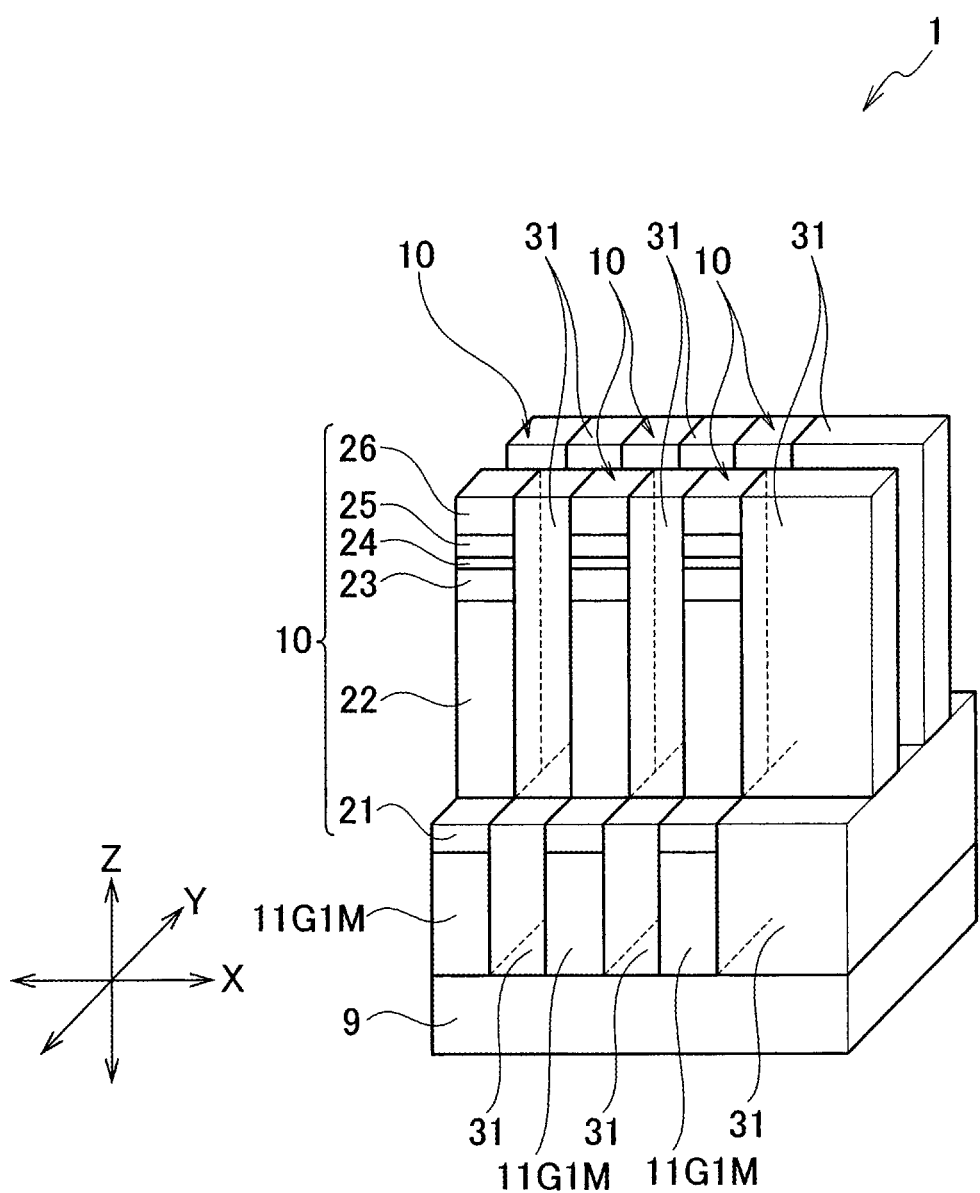
FIG. 21 is a schematic bird's-eye view configuration diagram for describing a third fabrication method of the nonvolatile semiconductor memory device according to the first embodiment, describing one process.

(e) Next, as illustrated in FIG. 21, the stacked film 10 formed on the first wiring layer 11G1M is processed in the X direction crossing the Y direction to form the pillar-shaped stacked film 10 including the memory cell.

(f) Next, the interlayer insulating films 31 are formed so as to be planarized by means of the CMP technique or the like. Consequently, the interlayer insulating film 31 is embedded into the trench between the pillar-shaped stacked films 10 formed by the processing.

(g) Next, as in the case illustrated in FIG. 16B, the second wiring layer 12G2W having a material different from that of the first wiring layer 11G1M is formed. For example, the second wiring layer 12G2W is formed of W.

(h) Next, as in the case illustrated in FIG. 17, the second wiring layer 12G2W is processed into a line shape to be extended in the X direction. Consequently, the second wiring layer 12G2W is connected to the electrode layer 26 of the memory cell 10.

The following steps are the same as those of the first fabrication method. More specifically, the nonvolatile semiconductor memory device 1 according to the first embodiment is formed in accordance with the steps illustrated in FIG. 18.

(Fabrication Method: Two-Layered Memory Cell Configuration)

FIGS. 22 to 29 illustrate a fabrication method of the nonvolatile semiconductor memory device according to the second embodiment. The fabrication method described herein can be applied also to a fabrication method of the nonvolatile semiconductor memory devices according to the third to seventh embodiments.

In the following description, the stacked films (121, 122, 123, 124, 125, 126) composing the memory cell 101, it may simply be referred to as the stacked film 101. In the following description, the stacked films (221, 222, 223, 224, 225, 226) composing the memory cell 102, it may simply be referred to as the stacked film 102.

Figure 28:
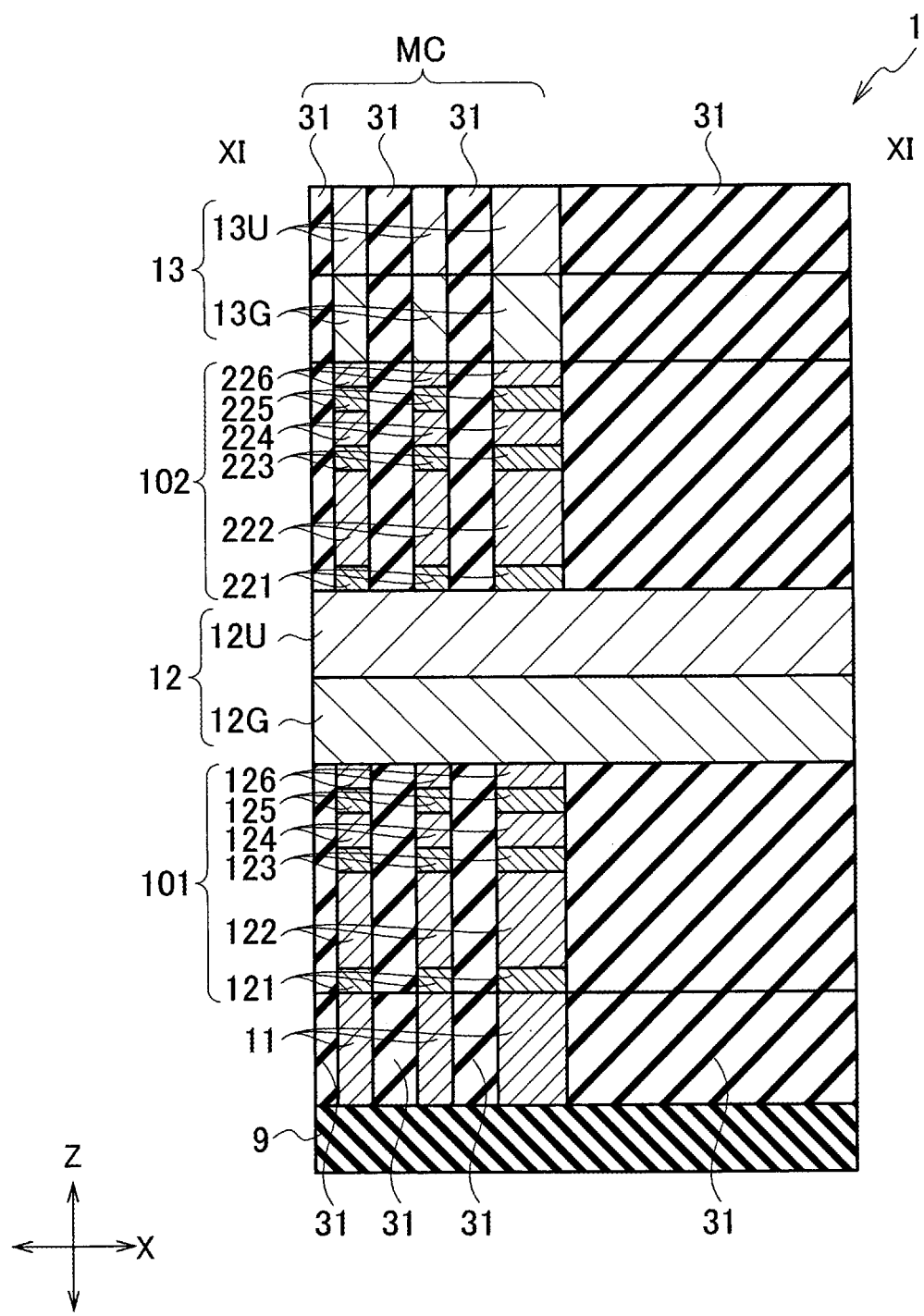
FIG. 28 is a schematic cross-sectional structure diagram taken in the line XI-XI of FIG. 23B, in the fabrication method of the nonvolatile semiconductor memory device according to the second embodiment.
Figure 29:
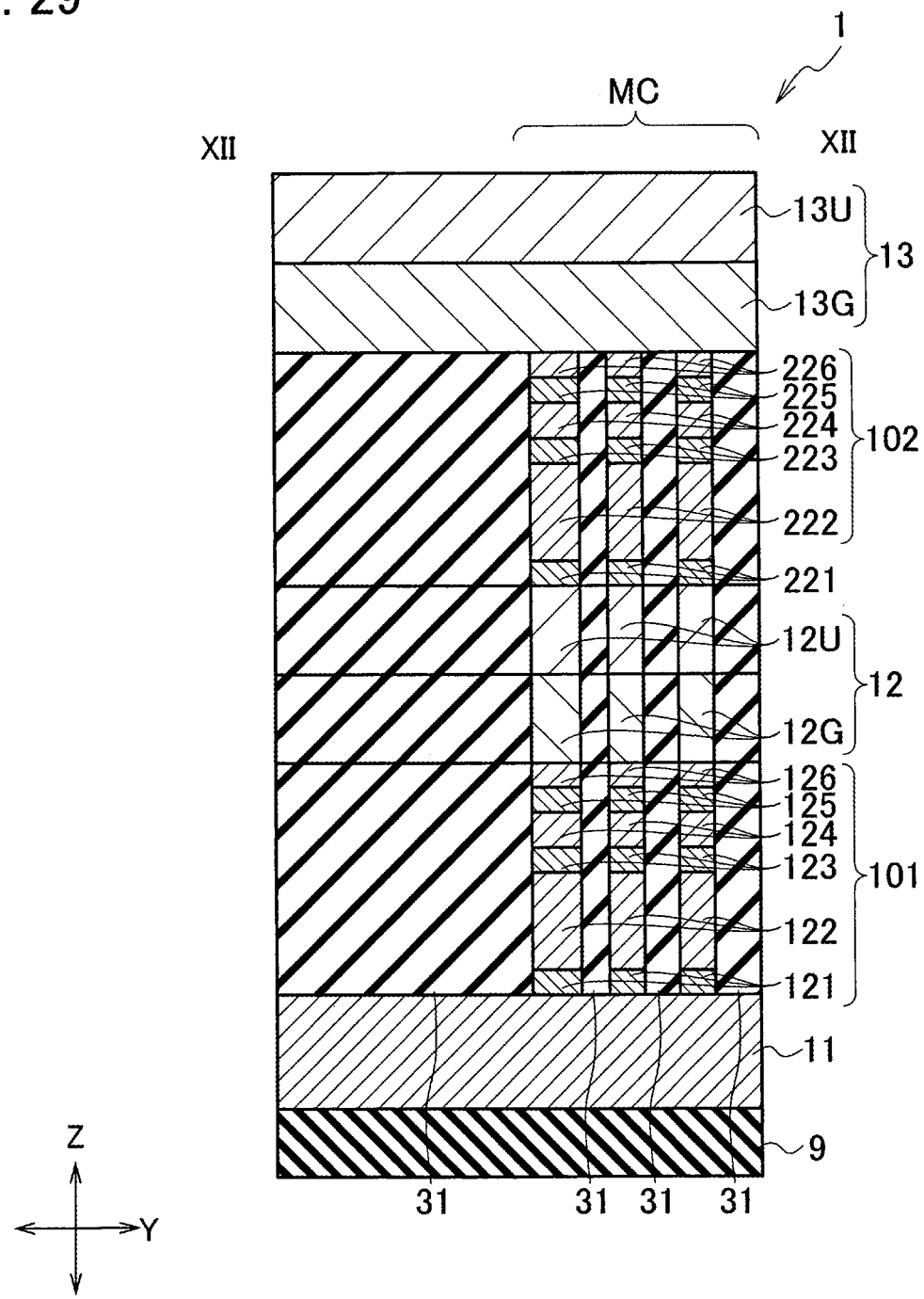
FIG. 29 is a schematic cross-sectional structure diagram taken in the line XII-XII of FIG. 23B, in the fabrication method of the nonvolatile semiconductor memory device according to the second embodiment.

As illustrated in FIGS. 28 and 29, the first memory cell 101 is disposed between the first wiring layer 11 and the second wiring layer 12, and the second memory cell 102 is disposed between the second wiring layer 12 and the third wiring layer 13. More specifically, the memory cells are arranged in two layers.

As illustrated in FIGS. 28 and 29, the nonvolatile semiconductor memory device includes: a plurality of first wiring layers 11 extended in the Y direction; a plurality of second wiring layers 12 extended in the X direction crossing the Y direction above the plurality of first wiring layers 11; and a first memory cell 101 disposed between the second wiring layer 12 and the first wiring layer 11 at a crossing portion between each of the plurality of second wiring layers 12 and each of the plurality of first wiring layers 11.

The nonvolatile semiconductor memory device further includes: a plurality of third wiring layers 13 extended in the first direction above the plurality of second wiring layers 12; and a second memory cell 102 disposed between the third wiring layer 13 and the second wiring layer 12 at a crossing portion between each of the plurality of third wiring layers 13 and each of the plurality of second wiring layers 12.

In the fabrication method of the nonvolatile semiconductor memory device according to the second embodiment, and a schematic planar pattern configuration for explaining one step is expressed as illustrated in FIGS. 22A and 22B and FIGS. 23A and FIG. 23B.

Figure 22A:
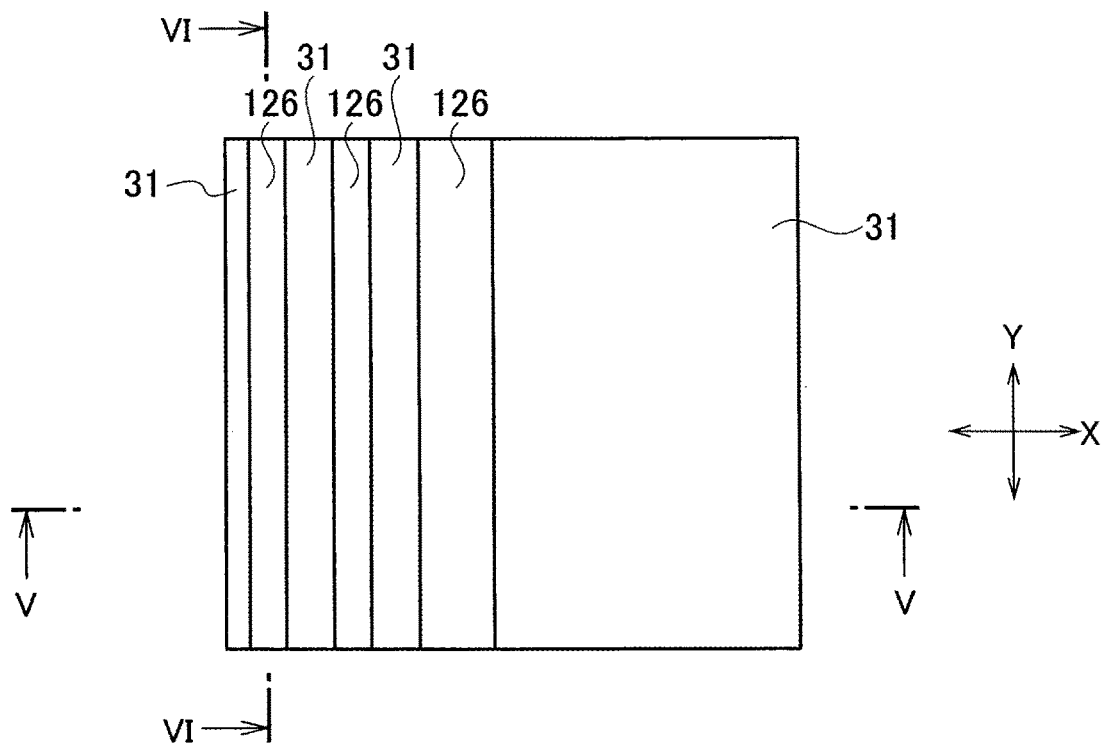
FIG. 22A is a schematic planar pattern configuration diagram for describing a fabrication method of the nonvolatile semiconductor memory device according to the second embodiment, describing one process (Phase 1).
Figure 24A:
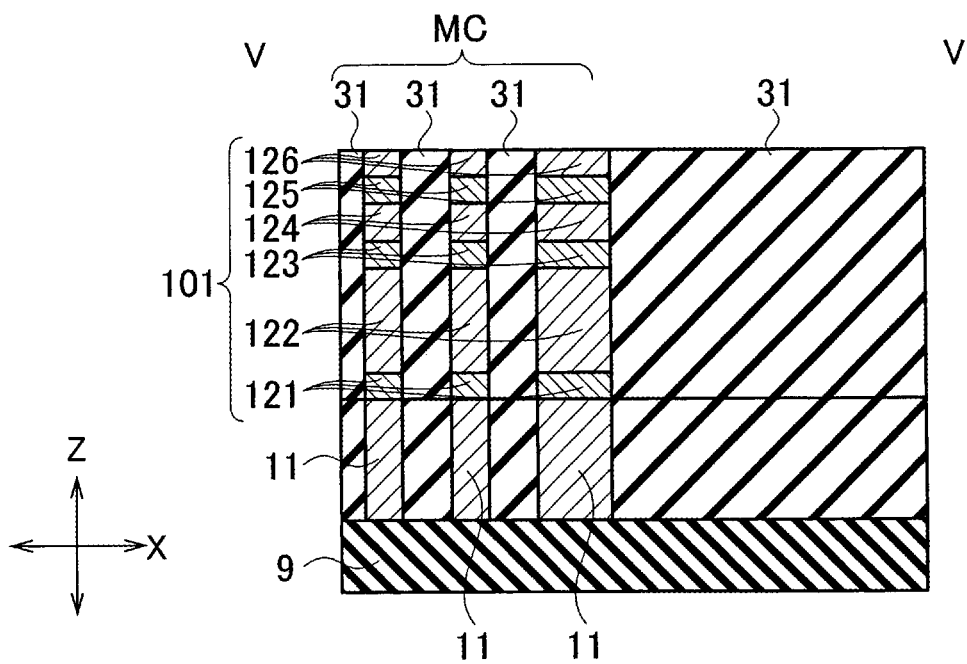
FIG. 24A is a schematic cross-sectional structure diagram taken in the line V-V of FIG. 22A, in the fabrication method of the nonvolatile semiconductor memory device according to the second embodiment.
Figure 24B:
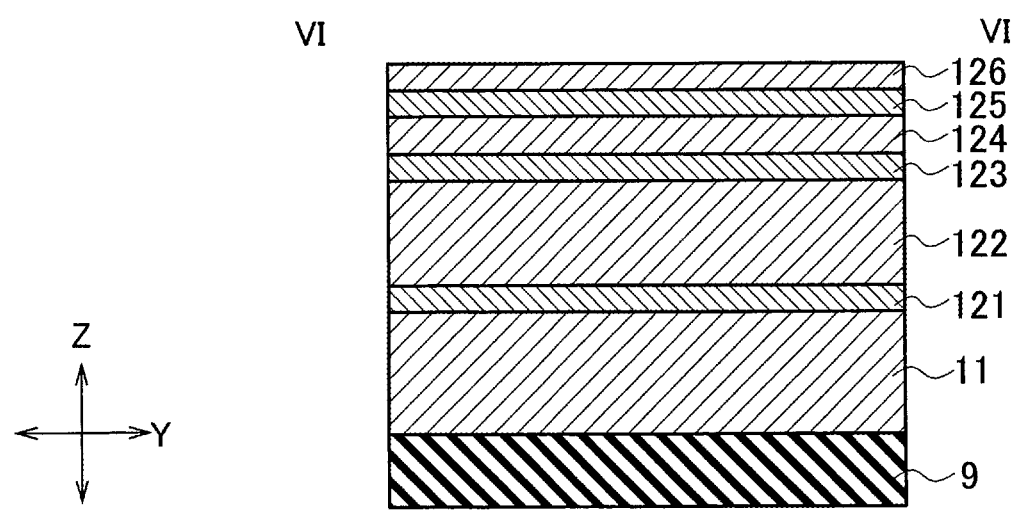
FIG. 24B is a schematic cross-sectional structure diagram taken in the line VI-VI of FIG. 22A, in the fabrication method of the nonvolatile semiconductor memory device according to the second embodiment.

A schematic cross-sectional structure taken in the line V-V of FIG. 22A is expressed as illustrated in FIG. 24A, and a schematic cross-sectional structure taken in the line VI-VI of FIG. 22A is expressed as illustrated in FIG. 24B.

(a) First, as in the case illustrated in FIG. 19, after pattern-forming the first wiring layer 11 on the insulating substrate 9, the interlayer insulating film 31 is formed so as to be planarized using a CMP technique or the like. Consequently, the interlayer insulating film 31 is embedded between the pattern-formed first wiring layers 11.

(b) Next, as in the case illustrated in FIG. 20A, the stacked films (121, 122, 123, 124, 125, 126) used as the memory cell 101 are sequentially formed on the first wiring layer 11 and the interlayer insulating film 31 which are pattern-formed. More specifically, a conductive film 121, a selector 122, a conductive film 123, a variable resistance film 124, a conductive film 125, and an electrode layer 126 are formed in order on the first wiring layer 11 and the interlayer insulating film 31.

(c) Next, the stacked film 101 and the interlayer insulating film 31 are processed, as in the case illustrated in FIG. 20B. For example, the stacked film 101 formed on the first wiring layer 11 is processed into a fin shape to be extended in the Y direction by means of the RIE method. The plurality of first wiring layer 11 and the plurality of stacked films 101 respectively formed on the first wiring layers 11 are arranged in the X direction which is orthogonal to the Y direction so as to sandwich a trench.

In addition, as in the case illustrated in FIGS. 18A and 18B, the stacked film 101 and the first wiring layer 11 may be simultaneously processed in the fin shape to be extended in the Y direction, after stacking the stacked films (121, 122, 123, 124, 125, 126) used as the memory cell 101 on the first wiring layer 11 formed on the insulating substrate 9.

(d) Next, the interlayer insulating films 31 are formed so as to be planarized by means of the CMP technique or the like. Consequently, as illustrated in FIGS. 24A and 24B, the interlayer insulating film 31 is embedded into the trench between the stacked films 101 formed by the processing.

While polishing and removing the interlayer insulating film 31 deposited above the stacked film 101 by means of the CMP method, for example, and the upper surface of the interlayer insulating film 31 is planarized. As illustrated in FIGS. 24A and 24B, an upper surface of the electrode layer 126 is exposed.

Figure 22B:
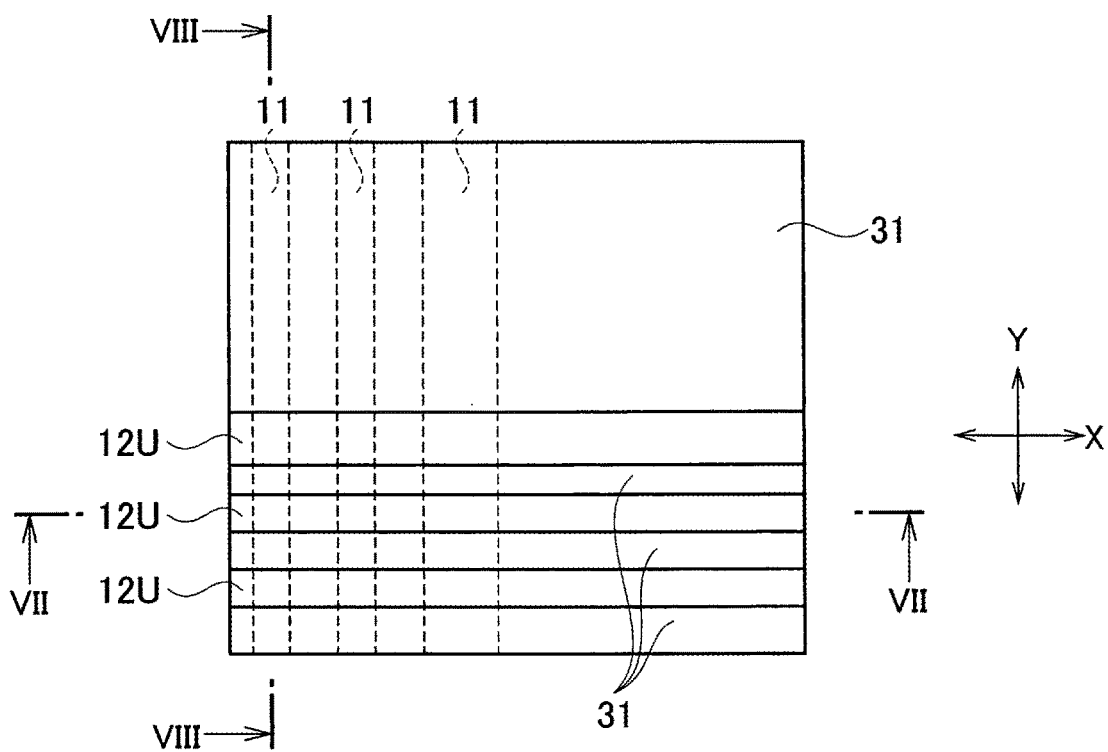
FIG. 22B is a schematic planar pattern configuration diagram for describing the fabrication method of the nonvolatile semiconductor memory device according to the second embodiment, describing one process (Phase 2).
Figure 25A:
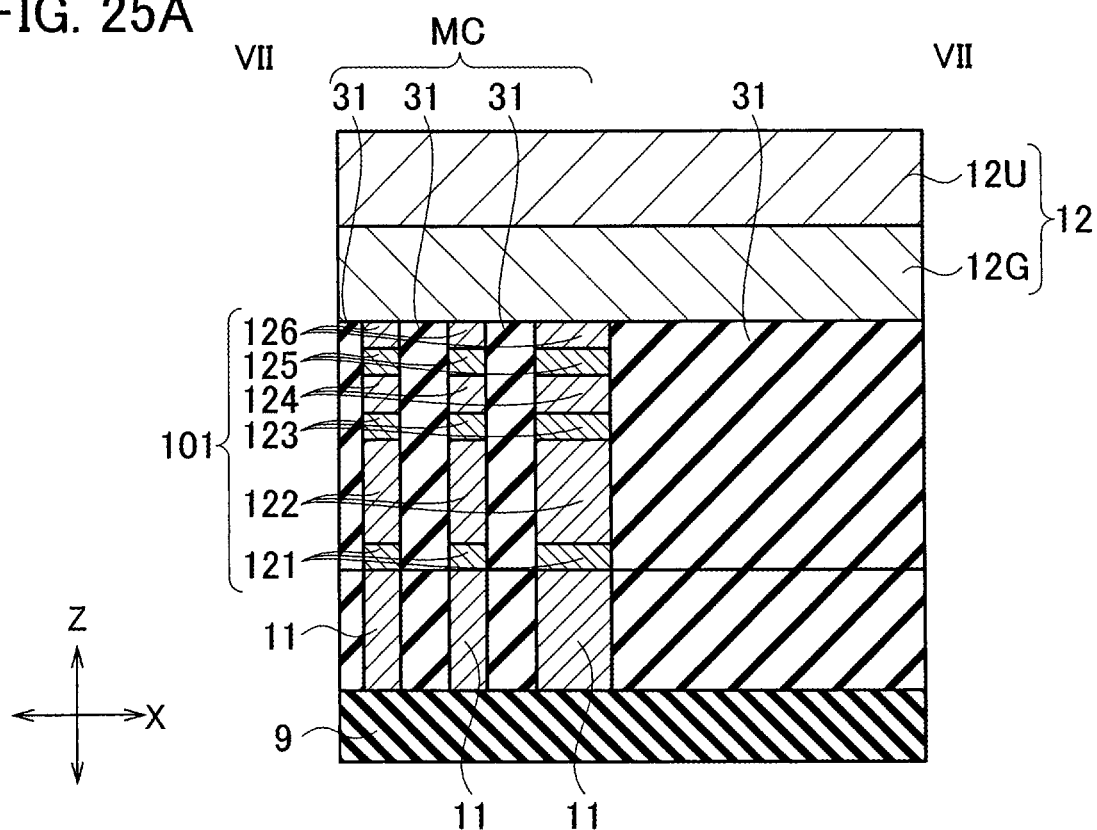
FIG. 25A is a schematic cross-sectional structure diagram taken in the line VII-VII of FIG. 22B, in the fabrication method of the nonvolatile semiconductor memory device according to the second embodiment.
Figure 25B:
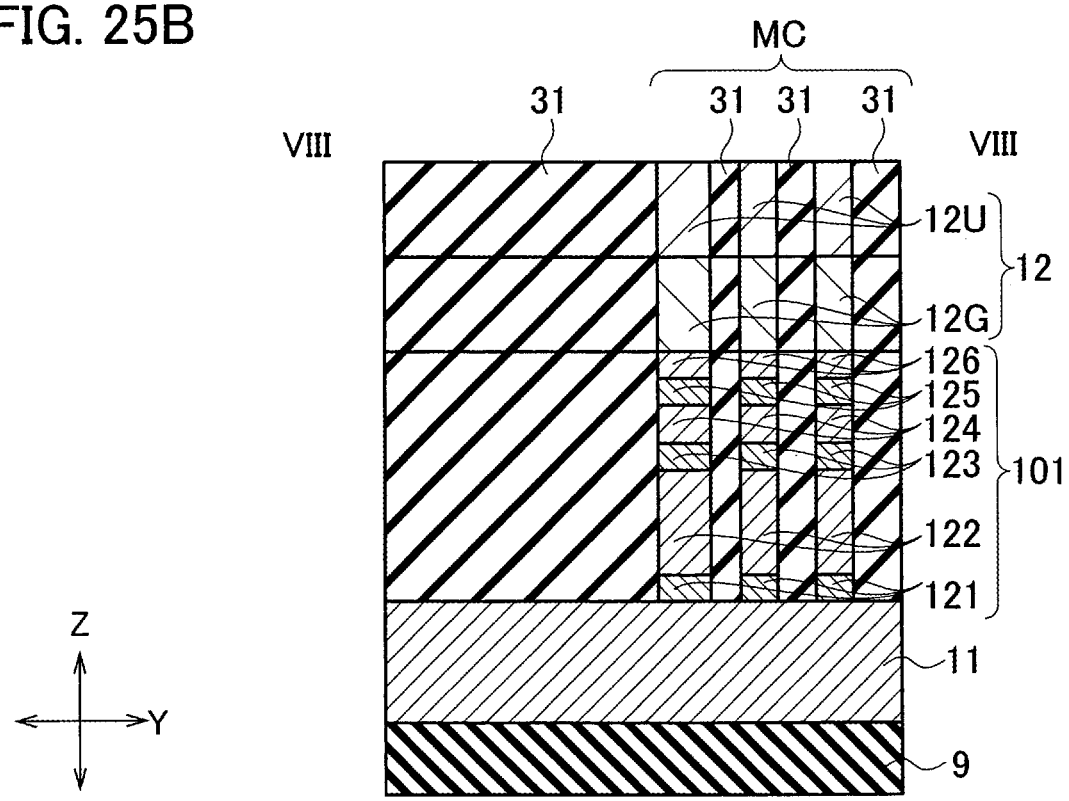
FIG. 25B is a schematic cross-sectional structure diagram taken in the line VIII-VIII of FIG. 22B, in the fabrication method of the nonvolatile semiconductor memory device according to the second embodiment.

A schematic cross-section structure taken in the line VII-VII of FIG. 22B is expressed as shown in FIG. 25A, and a schematic cross-sectional structure taken in the line VIII-VIII of FIG. 22B is expressed as illustrated in FIG. 25B.

(e) Next, as illustrated in FIGS. 25A and 25B, the second wiring layer 12 is formed. Moreover, the second wiring layer includes a layered structure including a second lower wiring layer 12G and a second upper wiring layer 12U. First, the second lower wiring layer 12G having a material different from that of the first wiring layer 11 is formed and patterned. The second lower wiring layer 12G is processed into a line shape to be extended in the X direction. Consequently, the second lower wiring layer 12G is connected to the electrode layer 126 of the memory cell 101.

Different dry etching gases are respectively used for the processing of the first wiring layer 11 and the processing of the second lower wiring layer 12G. The etching rate of the first wiring layer 11 is lower than the etching rate of the second lower wiring layer 12G. The different dry etching gases are respectively used for the processing of the first wiring layer 11 and the processing of the second lower wiring layer 12G, and thereby a difference in etching rate can be provided and increase the resistance can be suppressed.

The plurality of second lower wiring layers 12G are arranged in the Y direction with a gap therebetween, and an upper surface of the stacked film 101 (i.e., an upper surface of the electrode layer 126) and an upper surface of the interlayer insulating film 31 are exposed between the second lower wiring layers 12G adjacent to one another in the Y direction. The second lower wiring layer 12G is extended on the stacked film 101 in the X direction and also extended to the periphery.

(f) Next, the stacked film 101 and the interlayer insulating film 31 under between the second lower wiring layers 12G which are processed into the line shape are also processed by means of the RIE method, and thereby the pillar-shaped stacked films (121, 122, 123, 124, 125, 126) including the memory cell 101 are formed at the crossing portion between the second lower wiring layer 12G and the first wiring layer 11.

(g) Next, the interlayer insulating film 31 is formed so as to be planarized, and then the second upper wiring layer 12U having a material different from that of the second lower wiring layer 12G is formed and patterned. More specifically, the second upper wiring layer 12U is processed into a line shape to be extended in the X direction. Consequently, as illustrated in FIGS. 25A and 25B, the second upper wiring layer 12U is formed to be stacked on the second lower wiring layer 12G.

Different dry etching gases are respectively used for the processing of the second lower wiring layer 12G and the processing of the second upper wiring layer 12U. An etching rate of the second lower wiring layer 12G is lower than an etching rate of the second upper wiring layer 12U. The different dry etching gases are respectively used for the processing of the second lower wiring layer 12G and the processing of the second upper wiring layer 12U, and thereby a difference in etching rate can be provided and increase the resistance can be suppressed.

In the processing of the second upper wiring layer 12U, the wiring sheet resistance can be reduced by selecting a combination of the dry etching gas series by which the second lower wiring layer 12G is hard to be etched and each wiring layer.

Figure 23A:
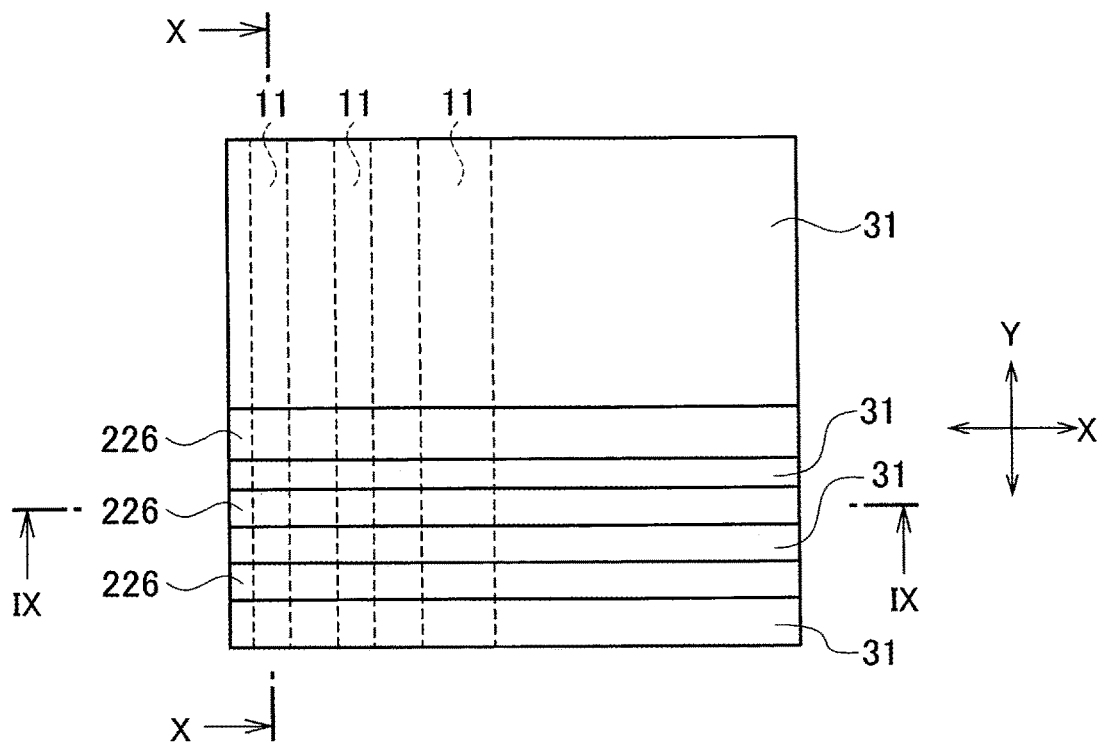
FIG. 23A is a schematic planar pattern configuration diagram for describing the fabrication method of the nonvolatile semiconductor memory device according to the second embodiment, describing one process (Phase 3).
Figure 26:
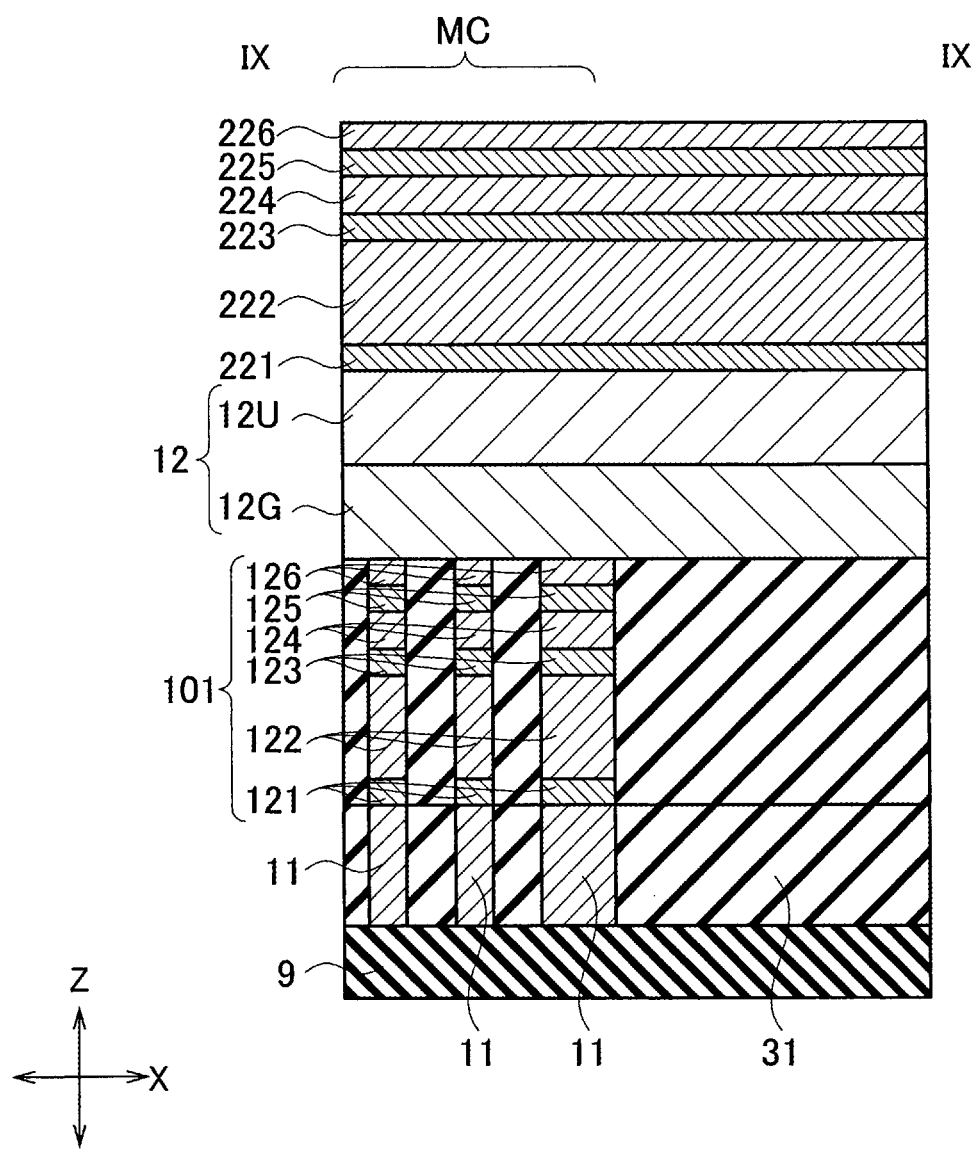
FIG. 26 is a schematic cross-sectional structure diagram taken in the line IX-IX of FIG. 23A, in the fabrication method of the nonvolatile semiconductor memory device according to the second embodiment.
Figure 27:
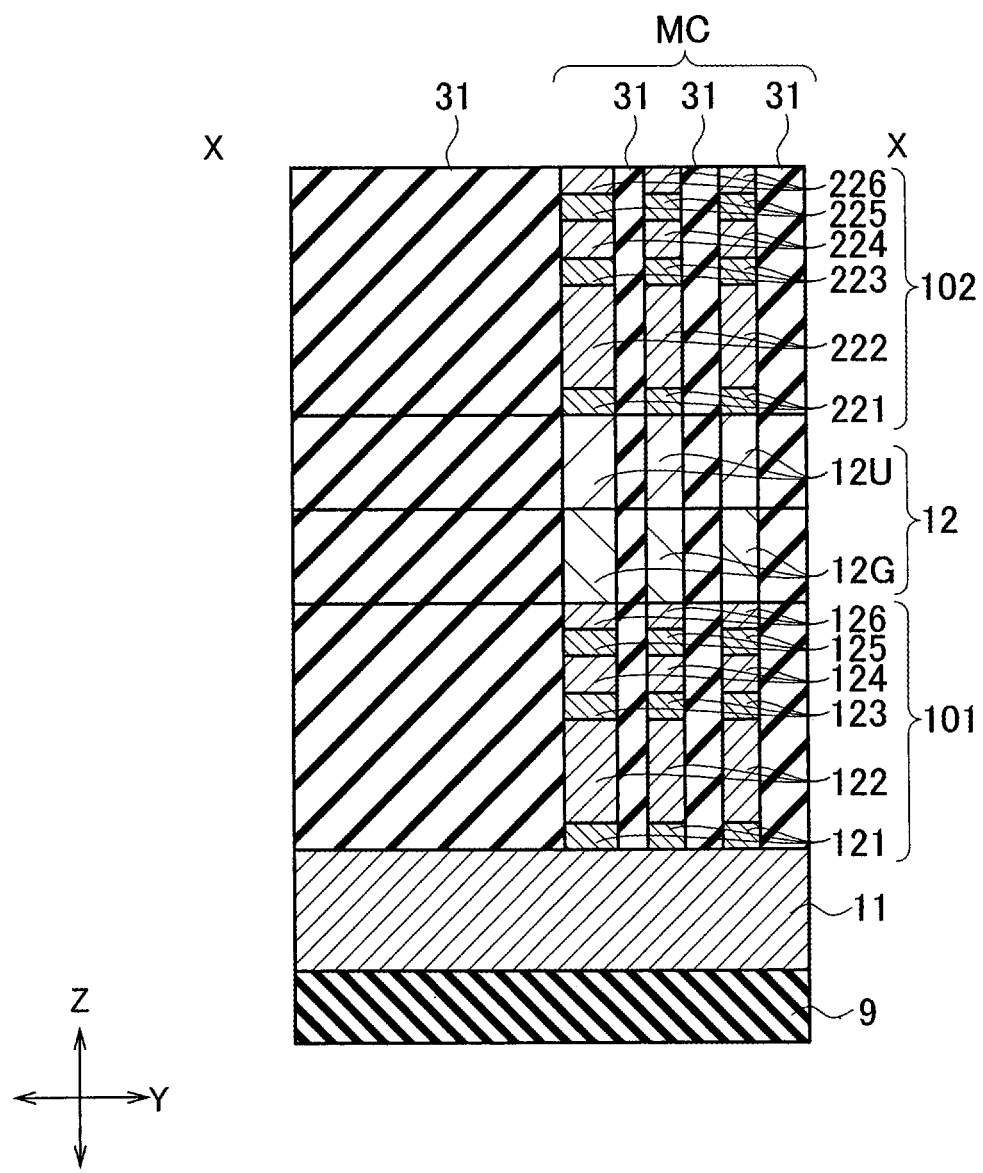
FIG. 27 is a schematic cross-sectional structure diagram taken in the line X-X of FIG. 23A, in the fabrication method of the nonvolatile semiconductor memory device according to the second embodiment.

A schematic cross-sectional structure taken in the IX-IX line of FIG. 23A is expressed as illustrated in FIG. 26, and a schematic cross-sectional structure taken in the X-X line of FIG. 23A is expressed as illustrated in FIG. 27.

(h) Next, the interlayer insulating film 31 is formed so as to be planarized, and then the stacked films (221, 222, 223, 224, 225, 226) used as the second memory cell 102 are sequentially formed on the second upper wiring layer 12U and the interlayer insulating film 31, as illustrated in FIG. 26. The conductive film 221, the selector 222, the conductive film 223, the variable resistance film 224, the conductive film 225, and the electrode layer 226 are formed in order on the first upper wiring layer 12U and the interlayer insulating film 31.

(i) Next, the stacked film 102 is processed. The stacked film 102 formed on the second upper wiring layer 12U is processed into a fin shape to be extended in the X direction. As a result, the stacked films (221, 222, 223, 224, 225, 226) used as the second memory cell 102 are formed.

(j) Next, the interlayer insulating films 31 are formed so as to be planarized. Consequently, as illustrated in FIG. 26 and FIG. 27, the interlayer insulating film 31 is embedded at the trench between stacked films 102 formed by processing.

Figure 23B:
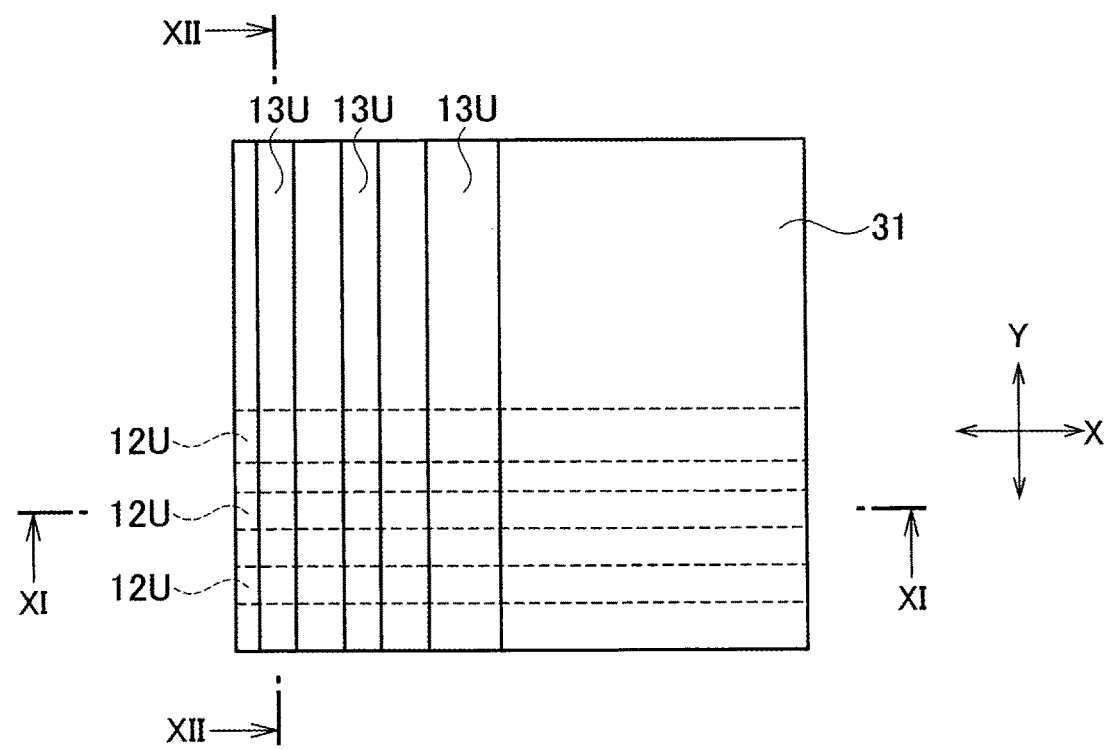
FIG. 23B is a schematic planar pattern configuration diagram for describing the fabrication method of the nonvolatile semiconductor memory device according to the second embodiment, describing one process (Phase 4).

A schematic cross-sectional structure taken in the XI-XI line of FIG. 23B is expressed as illustrated in FIG. 28, and a schematic cross-sectional structure taken in the XII-XII line of FIG. 23B is expressed as illustrated in FIG. 29.

(k) Next, the third wiring layer 13 having a material different from that of the second upper wiring layer 12U is formed. In the case of a two-layered memory cell configuration, the third wiring layer 13 may have a one-layer structure.

Different dry etching gases are respectively used for the processing of the third wiring layer 13 and the processing of the second upper wiring layer 12U. The etching rate of the second upper wiring layer 12U is lower than the etching rate of the third wiring layer 13. The different dry etching gases are respectively used for the processing of the third wiring layer 13 and the processing of the second upper wiring layer 12U, and thereby a difference in etching rate can be provided and increase the resistance can be suppressed.

The third wiring layer 13 may be formed in a stacked structure including a third lower wiring layer 13G and a third upper wiring layer 13U assuming the further stacking.

(l) In this case, first, the third lower wiring layer 13G having a material different from that of the second upper wiring layer 12U is formed and patterned. The third lower wiring layer 13G is processed into a line shape to be extended in the X direction. Consequently, the third lower wiring layer 13G is electrically connected to the electrode layer 226 of the memory cell 102.

Different dry etching gases are respectively used for the processing of the third lower wiring layer 13G and the processing of the second upper wiring layer 12U. The etching rate of the second upper wiring layer 12U is lower than the etching rate of the third lower wiring layer 13G. The different dry etching gases are respectively used for the processing of the third lower wiring layer 13G and the processing of the second upper wiring layer 12U, and thereby a difference in etching rate can be provided and increase the resistance can be suppressed.

(m) Next, the stacked film 101 and the interlayer insulating film 31 under between the third lower wiring layers 13G which are processed into the line shape are also processed, and thereby the pillar-shaped stacked films (221, 222, 223, 224, 225, 226) including the memory cell 102 are formed at the crossing portion between the third lower wiring layer 13G and the second upper wiring layer 12GU.

(n) Next, the interlayer insulating film 31 is formed so as to be planarized, and then the third lower wiring layer 13G having a material different from that of the third lower wiring layer 13U is formed and patterned. The third upper wiring layer 13U is processed into a line shape to be extended in the X direction. Consequently, as illustrated in FIGS. 28 and 29, the third upper wiring layer 13U is stacked on the third lower wiring layer 13G, and the third wiring layer 13 is formed in a stacked structure.

Different dry etching gases are respectively used for the processing of the third lower wiring layer 13G and the processing of the third upper wiring layer 13U. An etching rate of the third lower wiring layer 13G is lower than an etching rate of the third upper wiring layer 13U. The different dry etching gases are respectively used for the processing of the third lower wiring layer 13G and the processing of the third upper wiring layer 13U, and thereby a difference in etching rate can be provided and increase the resistance can be suppressed.

The fabrication method of the nonvolatile semiconductor memory device capable of reducing the wiring sheet resistance can be provided by selecting a combination of the dry etching gas series by which the third lower wiring layer 13G is hard to be etched and each wiring layer, in the processing of the third upper wiring layer 13U.

(o) Note that, as in the case illustrated in FIG. 21, after the steps illustrated in FIGS. 22A, 24A and 24B, the stacked film 101 formed on the first wiring layer 11 may be processed in the X direction crossing the Y direction to form the pillar-shaped stacked films (121, 122, 123, 124, 125, 126) including the memory cell 101.

(p) Next, the interlayer insulating film 31 is formed so as to be planarized by means of the CMP technique or the like. Consequently, the interlayer insulating film 31 is embedded into the trench between the pillar-shaped stacked films 101 formed by the processing. Furthermore, the second lower wiring layer 12G and the second upper wiring layer 12U can be formed as in the case of FIGS. 25A and 25B. The following steps are the same.

When the number of layers is further increased, the above-described steps are repeated in accordance with the number of the stacked memory cell arrays.

According to the nonvolatile semiconductor memory device according to the embodiments, the wiring layer opposite to each other at the cross-point so as to sandwich the one-layered memory cell structure include materials different from each other, and thereby, the lower wiring layer is hardly to be etched when the upper wiring layer is processed. Accordingly, it is possible to provide the nonvolatile semiconductor memory device capable of avoiding increase of the wiring sheet resistance and reducing the wiring sheet resistance, and the fabrication method of such a nonvolatile semiconductor memory device.

According to the nonvolatile semiconductor memory device according to the embodiments, the upper wiring layer and the lower wiring layer at the center portion of the two-layered memory cell structure contain materials different from each other, and thereby the lower wiring layer is hard to be etched in the fabrication process of the upper wiring layer. Therefore, it is possible to provide the nonvolatile semiconductor memory device capable of reducing the wiring sheet resistance, and the fabrication method of such a nonvolatile semiconductor memory device.

As described above, according to the nonvolatile semiconductor memory device according to the embodiments, it is possible to provide the nonvolatile semiconductor memory device capable of reducing the wiring sheet resistance, and the fabrication method of such a nonvolatile semiconductor memory device.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Such being the case, the embodiments cover a variety of embodiments and the like, whether described or not.

What is claimed is:

1. A nonvolatile semiconductor memory device comprising:
    a plurality of first wiring layers extended in a first direction and arranged in a second direction crossing the first direction;
    a plurality of second wiring layers extended in the second direction and arranged in the first direction above the plurality of the first wiring layers;
    a plurality of third wiring layers extended in the first direction and arranged in the second direction above the plurality of the second wiring layers;
    a first memory cell disposed between one second wiring layer of the plurality of the second wiring layers and one first wiring layer of the plurality of the first wiring layers at a crossing portion between the plurality of the second wiring layers and the plurality of the first wiring layers, the first memory cell comprising a first cell unit including a first variable resistance film and a first selector unit including a first selector;
    a second memory cell disposed between one third wiring layer of the plurality of the third wiring layers and the one second wiring layer at a crossing portion between the plurality of the third wiring layers and the plurality of the second wiring layers, the second memory cell comprising a second cell unit including a second variable resistance film and a second selector unit including a second selector;
    a third memory cell disposed between the one first wiring layer and another closest second wiring layer adjacent in the first direction to the second wiring layer on which the first memory cell is disposed, the third memory cell comprising a third cell unit including a third variable resistance film and a third selector unit including a third selector; and
    an insulation layer disposed between the first memory cell and the third memory cell, wherein
    the second wiring layer has a stacked structure including at least two layers having mutually different materials, wherein
    the second wiring layer includes a second lower wiring layer and a second upper wiring layer, one side of the second lower wiring layer is connected to the first memory cell, the other side of second lower wiring layer is connected to the second upper wiring layer, one side of the second upper wiring layer is connected to the second lower wiring layer, and the other side of the second upper wiring layer is connected to the second memory cell, wherein
    a part of the one side of second upper wiring layer is connected to the second lower wiring layer, and a rest of the one side of second upper wiring layer is not connected to the second lower wiring layer but is connected to the insulation layer disposed between the first memory cell and the third memory cell.

2. The nonvolatile semiconductor memory device according to claim 1, wherein
    the first wiring layer and the second lower wiring layer comprising materials different from each other.

3. The nonvolatile semiconductor memory device according to claim 1, wherein
    the third wiring layer and the second upper wiring layer comprising materials different from each other.

4. The nonvolatile semiconductor memory device according to claim 1, wherein
    a material of the second lower wiring layer and a material of the second upper wiring layer are selected, differently from each other or in different mixture ratios from each other, from any material, any silicide material, or any nitride selectable from the group including W, Mo, polysilicon, Ni, Co, Ti, and Cu.

5. The nonvolatile semiconductor memory device according to claim 1, wherein
a material of the first wiring layer and a material of the second lower wiring layer are selected, differently from each other or in different mixture ratios from each other, from any material, any silicide material, or any nitride selectable from the group including W, Mo, polysilicon, Ni, Co, Ti, and Cu.

6. The nonvolatile semiconductor memory device according to claim 1, wherein
a material of the third wiring layer and a material of the second upper wiring layer are selected, differently from each other or in different mixture ratios from each other, from any material, any silicide material, or any nitride selectable from the group including W, Mo, polysilicon, Ni, Co, Ti, and Cu.

7. The nonvolatile semiconductor memory device according to claim 1, wherein
the insulation layer is disposed between the first variable resistance film and the third variable resistance film.

8. A nonvolatile semiconductor memory device comprising:
a first wiring layer extended in a first direction;
a second wiring layer extended in the first direction, the second wiring layer adjacent to the first wiring layer in a second direction crossing the first direction;
a third wiring layer disposed above the first wiring layer and the second wiring layer so as to be extended in the second direction, the third wiring layer including third lower wiring and third upper wiring, the third upper wiring disposed on the third lower wiring and having a material different from that of the third lower wiring;
a fourth wiring layer disposed above the third upper wiring so as to be extended in the first direction;
a first memory cell disposed between the third lower wiring and the first wiring layer, the first memory cell comprising a first cell unit including a first variable resistance film and a first selector unit including a first selector;
a second memory cell disposed between the third lower wiring and the second wiring layer, the second memory cell comprising a second cell unit including a second variable resistance film and a second selector unit including a second selector; and
an insulation layer disposed between the first memory cell and the second memory cell, wherein
one side of the third lower wiring layer is connected to the first and second memory cells, the other side of third lower wiring layer is connected to the third upper wiring layer, and one side of the third upper wiring layer is connected to the third lower wiring layer, wherein
a part of the one side of third upper wiring layer is connected to the third lower wiring layer, and a rest of the one side of third upper wiring layer is not connected to the third lower wiring layer but is connected to the insulation layer disposed between the first memory cell and the second memory cell.

9. The nonvolatile semiconductor memory device according to claim 8, wherein
a material of the fourth wiring layer is different from a material of the third upper wiring.

10. The nonvolatile semiconductor memory device according to claim 8, wherein
a material of the first wiring layer is different from a material of the third lower wiring.

11. The nonvolatile semiconductor memory device according to claim 8, wherein
a material of the first wiring layer is different from a material of the fourth wiring layer.

12. The nonvolatile semiconductor memory device according to claim 8, further comprising
a third memory cell disposed between the fourth wiring layer and the third upper wiring, the third memory cell comprising a third cell unit including a third variable resistance film and a third selector unit including a third selector.

13. The nonvolatile semiconductor memory device according to claim 8, wherein
the insulation layer is disposed between the first variable resistance film and the second variable resistance film.

14. The nonvolatile semiconductor memory device according to claim 8, wherein
a material of the third lower wiring layer and a material of the third upper wiring layer are selected, differently from each other or in different mixture ratios from each other, from any material, any silicide material, or any nitride selectable from the group including W, Mo, polysilicon, Ni, Co, Ti, and Cu.

15. The nonvolatile semiconductor memory device according to claim 8, wherein
a material of the first wiring layer and a material of the third lower wiring layer are selected, differently from each other or in different mixture ratios from each other, from any material, any silicide material, or any nitride selectable from the group including W, Mo, polysilicon, Ni, Co, Ti, and Cu.

16. The nonvolatile semiconductor memory device according to claim 8, wherein
a material of the fourth wiring layer and a material of the third upper wiring layer are selected, differently from each other or in different mixture ratios from each other, from any material, any silicide material, or any nitride selectable from the group including W, Mo, polysilicon, Ni, Co, Ti, and Cu.

* * * * *